(12) United States Patent
Vagos et al.

(10) Patent No.: US 10,621,264 B2
(45) Date of Patent: Apr. 14, 2020

(54) CORRECTION OF ANGULAR ERROR OF PLANE-OF-INCIDENCE AZIMUTH OF OPTICAL METROLOGY DEVICE

(71) Applicant: ONTO INNOVATION INC., Wilmington, MA (US)

(72) Inventors: Pedro Vagos, Chennevieres (FR); Ye Feng, Hillsboro, OR (US); Daniel Thompson, San Jose, CA (US); Yan Zhang, Portland, CA (US)

(73) Assignee: ONTO INNOVATION INC., Wilmington, MA (US)

( * ) Notice: Subject to any disclaimer, the term of this patent is extended or adjusted under 35 U.S.C. 154(b) by 0 days.

(21) Appl. No.: 16/416,775

(22) Filed: May 20, 2019

(65) Prior Publication Data

US 2019/0272305 A1    Sep. 5, 2019

Related U.S. Application Data

(62) Division of application No. 13/831,456, filed on Mar. 14, 2013, now Pat. No. 10,296,554.

(60) Provisional application No. 61/771,476, filed on Mar. 1, 2013.

(51) Int. Cl.
  *G03F 7/20* (2006.01)
  *G06F 17/00* (2019.01)
(52) U.S. Cl.
  CPC .......... *G06F 17/00* (2013.01); *G03F 7/70516* (2013.01); *G03F 7/70616* (2013.01)

(58) Field of Classification Search
  CPC .................................................. G03F 7/70516
  See application file for complete search history.

(56) References Cited

U.S. PATENT DOCUMENTS

| | | | |
|---|---|---|---|
| 4,306,809 A | 12/1981 | Azzam | |
| 8,040,511 B1 | 10/2011 | Krishnan et al. | |
| 8,427,645 B2 | 4/2013 | Vagos et al. | |
| 8,525,993 B2 | 9/2013 | Rabello et al. | |
| 2014/0249768 A1 | 9/2014 | Vagos et al. | |

OTHER PUBLICATIONS

Goldstein, "Mueller matrix dual-rotating retarder polarimeter," Applied Optics (1992).*

(Continued)

*Primary Examiner* — Hyun D Park
(74) *Attorney, Agent, or Firm* — Paradice and Li LLP

(57) ABSTRACT

Optical metrology is used to calibrate the plane-of-incidence (POI) azimuth error by determining and correcting an azimuth angle offset. The azimuth angle offset may be determined by measuring at least a partial Mueller matrix from a calibration grating on a sample held on a stage for a plurality of POI azimuth angles. An axis of symmetry is determined for a curve describing a value of a Mueller matrix element with respect to POI azimuth angle, for each desired wavelength and each desired Mueller matrix element. The axis of symmetry may then be used to determine the azimuth angle offset, e.g., by determining a mean, median or average of all, or a filtered subset, of the axes of symmetry. If desired, an axis of symmetry may be determined for data sets other than Mueller matrix elements, such as Fourier coefficients of measured signals.

24 Claims, 12 Drawing Sheets

(56) References Cited

OTHER PUBLICATIONS

Schmidt, D. et al. (2010). "Magneto-optical properties of cobalt slanted columnar thin films," *Applied Physics Letters* 96:091906, 4 pages.
Wilson, P.M. et al. (2013). "Structural and optical properties of cobalt slanted columnar thin films conformally coated with graphene by chemical vapor deposition," visited at <http://arxiv.org/pdf/1312.5363v1.pdf> on Jan. 23, 2014, 4 pages.
Foldyna, M. et al. (Dec. 1, 2008). "Accurate dimensional characterization of periodic structures by spectroscopic Mueller polarimetry," *Proceedings of SPIE* 7140(71400I):1-11.
International Search Report and Written Opinion dated Jun. 18, 2014 for International Application No. PCT/2014/015168 filed on Feb. 6, 2014, 11 pages.
U.S. Appl. No. 13/831,456, filed Mar. 14, 2013, 53 pages.

\* cited by examiner

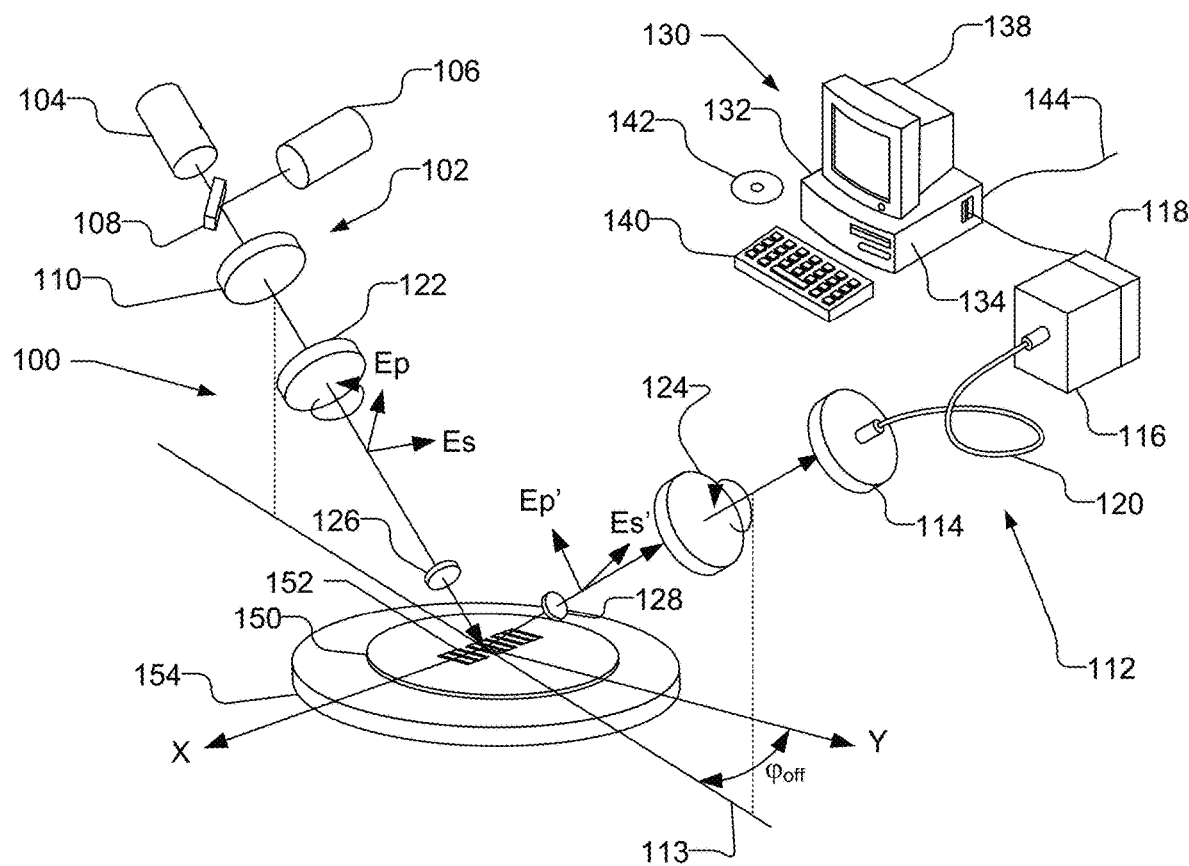
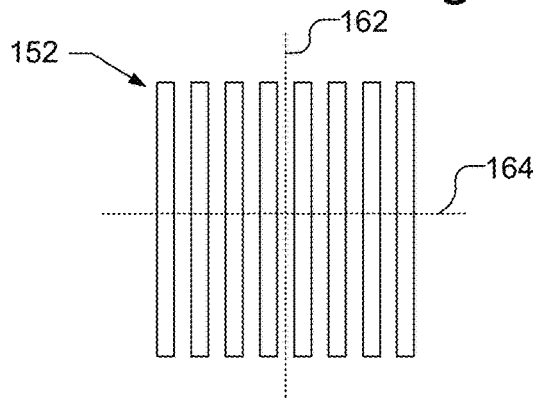 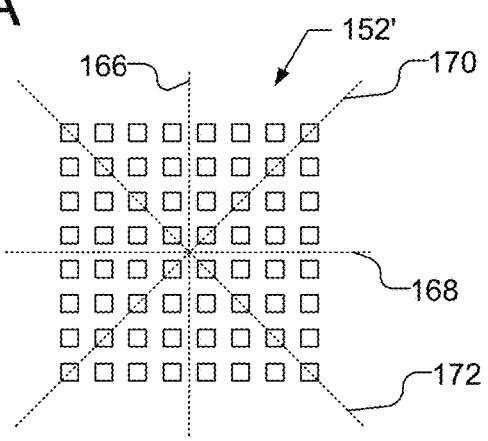
Fig. 2A  Fig. 2B $$MM = \begin{bmatrix} M11 & M12 & M13 & M14 \\ M21 & M22 & M23 & M24 \\ M31 & M32 & M33 & M34 \\ M41 & M42 & M43 & M44 \end{bmatrix} =$$

○ = Symmetric
● = Antisymmetric

CORRECTION OF ANGULAR ERROR OF PLANE-OF-INCIDENCE AZIMUTH OF OPTICAL METROLOGY DEVICE

CROSS-REFERENCE TO RELATED APPLICATION(S)

This application is a divisional of U.S. application Ser. No. 13/831,456, filed Mar. 14, 2013, entitled "Correction Of Angular Error Of Plane-Of-Incidence Azimuth Of Optical Metrology Device," which claims priority under 35 USC 119 to U.S. Provisional Application No. 61/771,476, filed Mar. 1, 2013, and entitled "Correction of Angular Error of Plane-of-Incidence Azimuth of Ellipsometer" both of which are incorporated herein by reference.

BACKGROUND

Scatterometry has been used extensively for the characterization of critical dimensions (CD) and detailed side-wall profiles of periodic structures in microelectronics fabrication processes. Scatterometry can provide accurate and high-precision measurement for 2D and 3D structures used in integrated circuits. One source of error, e.g., from one optical system to another, is an angular error in the plane-of-incidence (POI) azimuth angle, which is the angle of POI of the probe beam (or reflected beam) and a reference direction that is in the plane of the sample.

Many scatterometry systems do not attempt to control the POI azimuth angle error. Advanced scatterometry, however, demands a high degree of alignment accuracy of the measurement target orientation relative to the plane-of-incidence (POI). When left uncontrolled, the angular error in the POI azimuth angle will generate a spectral signature that will varies from one system to another. Accurate hardware alignment, e.g., down to 0.2°, however, is extremely difficult to achieve.

SUMMARY

Optical metrology is used to calibrate the plane-of-incidence (POI) azimuth error by determining and correcting an azimuth angle offset. The azimuth angle offset may be determined by measuring at least a partial Mueller matrix from a calibration grating on a sample that is held on a stage for a plurality of POI azimuth angles. An axis of symmetry is determined for a curve describing a value of a Mueller matrix element with respect to POI azimuth angle, for each desired wavelength and each desired Mueller matrix element. The axis of symmetry may then be used to determine the azimuth angle offset, e.g., by determining a mean, median or average of all, or a filtered subset, of the axes of symmetry. If desired, an axis of symmetry may be determined for data sets other than Mueller matrix elements, such as Fourier coefficients of measured signals.

In one implementation, a method of calibration of an azimuth angle offset between a plane-of-incidence (POI) of an optical system of an optical metrology tool and an orientation of a calibration grating on a sample at a nominal orientation with respect to the POI includes measuring at least a partial Mueller matrix from a calibration grating on a sample that is held on a stage for a plurality of POI azimuth angles; determining an axis of symmetry for a curve describing a value of a Mueller matrix element with respect to POI azimuth angle; and using the axis of symmetry to determine the azimuth angle offset.

In one implementation, an apparatus includes a stage configured to hold a sample with a calibration grating; an optical system to produce a beam of light to be incident on the calibration grating and to receive the beam of light after the beam of light interacts with the calibration grating, the beam of light having a plane of incidence (POI), wherein there is an azimuth angle offset between the POI and an orientation of a calibration grating on a sample at a nominal orientation with respect to the POI; a detector that detects and generates signals in response to the beam of light after the beam of light interacts with the calibration grating; and a processor coupled to receive the signals from the detector, wherein the processor is configured to measure at least a partial Mueller matrix from the signals for a plurality of POI azimuth angles, determine an axis of symmetry for a curve describing a value of a Mueller matrix element with respect to POI azimuth angle, and use the axis of symmetry to determine the azimuth angle offset.

In one implementation, a method of calibration of an azimuth angle offset between a plane-of-incidence (POI) of an optical system of an optical metrology tool and an orientation of a calibration grating on a sample at a nominal orientation with respect to the POI includes determining Fourier coefficients of signals measured by an optical metrology device from a calibration grating on a sample that is held on a stage for a plurality of POI azimuth angles; determining an axis of symmetry for a curve describing the Fourier coefficients with respect to POI azimuth angle; and using the axis of symmetry to determine the azimuth angle offset.

In one implementation, an apparatus includes a stage configured to hold a sample with a calibration grating; an optical system to produce a beam of light to be incident on the calibration grating and to receive the beam of light after the beam of light interacts with the calibration grating, the beam of light having a plane of incidence (POI), wherein there is an azimuth angle offset between the POI and an orientation of a calibration grating on a sample at a nominal orientation with respect to the POI; a detector that detects and generates signals in response to the beam of light after the beam of light interacts with the calibration grating; and a processor coupled to receive the signals from the detector, wherein the processor is configured to determine Fourier coefficients of the signals for a plurality of POI azimuth angles, determine an axis of symmetry for a curve describing the Fourier coefficients with respect to POI azimuth angle, and use the axis of symmetry to determine the azimuth angle offset.

In one implementation, a method of calibration of an azimuth angle offset between a plane-of-incidence (POI) of an optical system of an optical metrology tool and an orientation of a calibration grating on a sample at a nominal orientation with respect to the POI includes (a) illuminating a calibration grating on a sample held on a stage with polarized light at a POI azimuth angle; (b) analyzing the light after the light interacts with the calibration grating; (c) detecting the analyzed light; (d) generating at least a partial Mueller matrix for the POI azimuth angle using the detected light; (e) repeating (a) through (d) for different POI azimuth angles; generating a curve describing a value of a Mueller matrix element with respect to POI azimuth angle; (f) determining an axis of symmetry for the curve; and (g) using the axis of symmetry to determine the azimuth angle offset.

In one implementation, a method of calibration of an azimuth angle offset between a plane-of-incidence (POI) of an optical system of an optical metrology tool and an orientation of a calibration grating on a sample at a nominal orientation with respect to the POI includes measuring signals from the calibration grating that is held on a stage for a plurality of POI azimuth angles; performing a Fourier analysis on a curve describing the signals with respect to POI azimuth angle to determine an axis of symmetry; and using the axis of symmetry to determine the azimuth angle offset.

In one implementation, a method of calibration of an azimuth angle offset between a plane-of-incidence (POI) of an optical system of an optical metrology tool and an orientation of a calibration grating on a sample at a nominal orientation with respect to the POI, includes measuring signals from the target grating that is held on a stage for a plurality of POI azimuth angles; determining an axis of symmetry for a curve that describes the measured data with respect to the POI azimuth angle, wherein determining an axis of symmetry comprises: generating a flipped curve by flipping the curve about a first axis at an estimated axis of symmetry and about a second axis at a fixed value of the signal, the second axis being orthogonal to the first axis; determining a distance between the curve and the flipped curve; repeatedly generating flipped curves at different estimated axes of symmetry and determining the distance between the curve and each flipped curve until a minimum distance is determined; using the estimated axis of symmetry that corresponds to the minimum distance as the axis of symmetry; and using the axis of symmetry to determine the azimuth angle offset

BRIEF DESCRIPTION OF THE DRAWINGS

FIG. 1A illustrates an optical metrology device, in the form of an ellipsometer, that is capable of measuring and correcting the angular error of the POI azimuth angle based on the detection of a point of symmetry in signals measured from a target grating.

FIGS. 2A and 2B illustrates a top view of a two-dimensional calibration grating and three-dimensional grating, respectively, both of which include at least one mirror symmetry plane.

DETAILED DESCRIPTION

FIG. 1A illustrates an optical metrology device 100, in the form of an ellipsometer, that may be calibrated by measuring and correcting an azimuth angle offset between the plane-of-incidence (POI) 113 of the optical system and the orientation of microscopic structures on a sample. The azimuth angle offset may be measured by detecting a point of symmetry of signals measured from a calibration sample, illustrated as a calibration grating 152 on a sample 150 that is held on a stage 154.

Figure 1B:
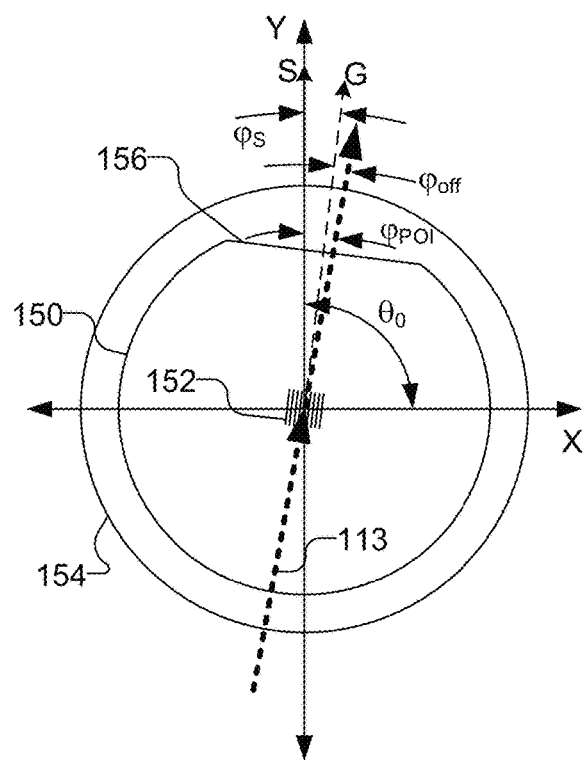
FIGS. 1B-1E illustrates a top view of the stage 154, sample 150 with calibration grating 152 and the POI 113 of the optical system at different POI azimuth angles.

FIG. 1B illustrates a top view of the stage 154, sample 150 with calibration grating 152 and the POI 113 of the optical system to illustrate the azimuth angle offset $\varphi_{off}$ between the POI 113 and an orientation of the microscopic patterns on the sample 150 when the sample 150 is loaded on the stage 154 at a nominal orientation. The microscopic patterns are the patterns that are to be measured by the optical metrology device 100, i.e., the calibration grating 152 of sample 150. As shown in FIG. 1B, the orientation of the microscopic patterns, i.e., calibration grating 152, is identified by vector G, which is illustrated as being parallel with the direction of the lines in the calibration grating 152, but may be perpendicular to the direction of the lines in the calibration grating 152 if desired. When the sample 150 is loaded on the stage 154, a deskew process is used to align a notch or flat 156 and/or macroscopic patterns on the sample 150 to a stage reference S to place the sample 150 at the nominal position. FIG. 1B illustrates the stage reference S as being aligned with the stage translation direction Y, and thus, at an angle $\theta_0=90°$ with respect to the stage translation direction X, when the sample 150 is loaded on the stage 154 in the nominal position, but of course, the nominal position may have other orientations. Typically, however, in the nominal position, there may be a small angular error $\varphi_S$ between the stage reference S and the orientation G of the calibration grating 152, as illustrated in FIG. 1B, due to inaccuracies in the deskew process as well as possible misalignment of the orientation G of the calibration grating 152 with respect to the flat 156 (or other fiduciary used for deskewing). Once the sample 150 is loaded on the stage 154, the angular error $\varphi_S$ between the orientation G of the calibration grating 152 and the stage reference S remains constant while the stage 154 and sample 150 are rotated with respect to the stage translation direction Y and the POI 113.

Additionally, as illustrated in FIG. 1B, the POI 113 of the optical system of the optical metrology device 100 may have an angular error $\varphi_{POI}$ with respect to a stage translation direction Y, and thus, the stage reference S when the calibration grating 152 is loaded on the stage 154 at the nominal orientation. The angular error $\varphi_{POI}$ between the POI 113 and the stage translation direction Y remains constant when the stage 154 and sample 150 are rotated. Neither the angular error $\varphi_S$ nor the angular error $\varphi_{POI}$ may be precisely known, resulting in an unknown POI azimuth angle offset $\varphi_{off}$ between the POI 113 and the orientation G of the calibration grating 152.

Figure 1C:
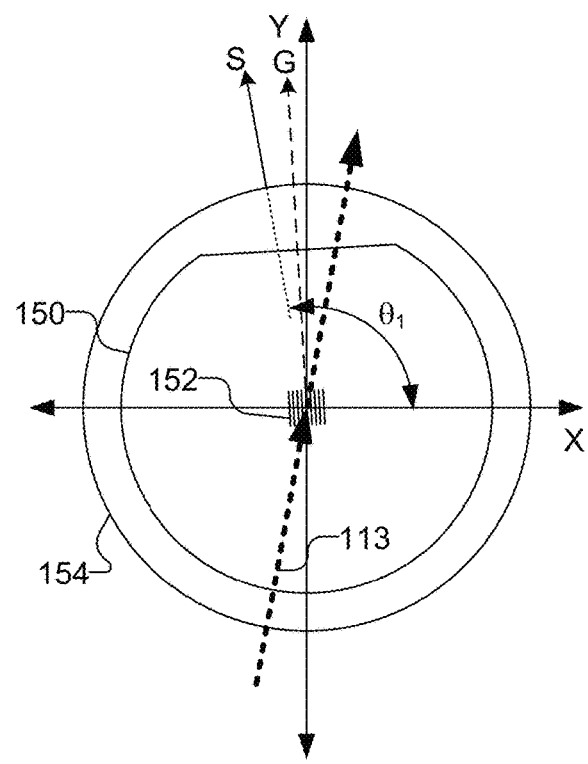
Figure 1D:
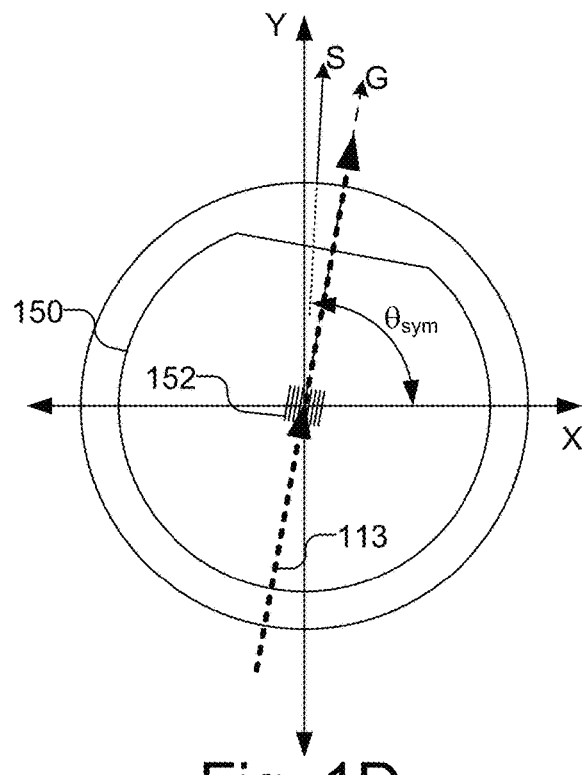
Figure 1E:
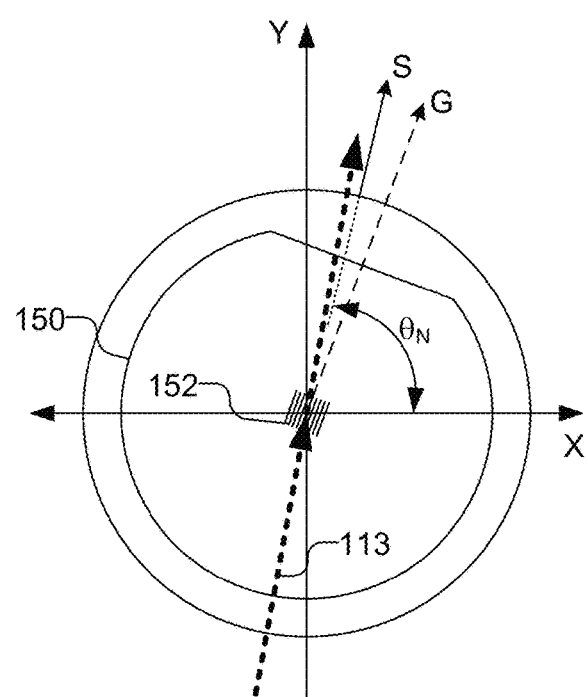

FIGS. 1C, 1D, and 1E illustrate top views of the stage 154, sample 150 with calibration grating 152 and the POI 113 of the optical system similar to that shown in FIG. 1B, but with the stage 150 (and, thus, the calibration grating 152 on the sample 150) rotated by various angles θ with respect to the stage translation direction X during the determination of the azimuth angle offset $\varphi_{off}$ between the POI 113 and the orientation G of the calibration grating 152. FIG. 1C, by way of example, illustrates the rotation of the stage 154 by an angle $\theta_1$ between the stage reference S and the stage translation direction X. It should be understood, as the calibration grating 152 has a fixed orientation with respect to the sample reference S and the POI 113 is fixed with respect to the stage translation directions X and Y, the stage rotation θ is equivalent to the rotation of the orientation G of the calibration grating 152 with respect to the POI 113, and therefore, rotation θ is sometimes referred to herein as the POI azimuth angle θ. Accordingly, a nominal POI azimuth angle $\theta_0$ may be identified, e.g., when the stage reference S is aligned with a stage translation direction, e.g., when the sample 150 is loaded on the stage 154, as illustrated in FIG. 1B. It should be understood that the nominal POI azimuth angle $\theta_0$ when measured from the stage translation direction X may be 90°, while when measured from the stage translation direction Y may be 0°, but that the POI azimuth angle θ may be equivalently measured from or any other coordinate system that is fixed with respect to the translation directions X, Y.

As described herein, the determination of the POI azimuth angle offset $\varphi_{off}$ may be performed based on the detection of an axis of symmetry in signals measured from the calibration grating 152 at different POI azimuth angles θ, e.g., by rotating the stage 154 and thus calibration grating 152 with respect to the POI 113 of the optical system. To determine the azimuth angle offset $\varphi_{off}$ between the POI 113 and the orientation G of the calibration grating 152, the stage 154 (or equivalently the calibration grating 152) is rotated to a plurality of angles, e.g., from angle $\theta_1$ to angle $\theta_N$ illustrated in FIG. 1E, and at each POI azimuth angle θ, the optical metrology device 100 measures the one or more desired signals. The measurements at multiple POI azimuth angles θ may be used to generate a curve for the measurement values with respect to the angle θ. Because the orientation G of the calibration grating 152 is aligned with a mirror symmetry plane of the calibration grating 152 (i.e., parallel with or perpendicular to the lines in the calibration grating 152), an axis of symmetry in the curve will correspond to the POI azimuth angle $\theta_{sym}$ (sometimes referred to herein as the symmetrical azimuth angle), shown in FIG. 1D, when the orientation G of the calibration grating 152 is aligned with the POI 113. Thus, to determine the azimuth angle offset $\varphi_{off}$ between the POI 113 and the orientation G of the calibration grating 152, the nominal POI azimuth angle $\theta_0$ is subtracted from the determined symmetrical azimuth angle $\theta_{sym}$. Thus, for example, as illustrated in FIG. 1D, the determined symmetrical azimuth angle $\theta_{sym}$ is 87°, while the nominal POI azimuth angle $\theta_0$ is 90°, and thus, the azimuth angle offset $\varphi_{off}$ is 87°−90°=−3°, i.e., 3° in the clockwise direction. It should be understood that if the POI azimuth angles θ were measured from the stage translation direction Y instead of X, the nominal POI azimuth angle $\theta_0$ would be 0° and, thus, subtraction of the nominal POI azimuth angle $\theta_0$ from the determined symmetrical azimuth angle $\theta_{sym}$ would be unnecessary. In other words, the determined symmetrical azimuth angle $\theta_{sym}$ from the stage translation direction Y would be measured as −3° which is equal to the azimuth angle offset $\varphi_{off}$.

As discussed below, it may be desirable to determine the symmetrical azimuth angle $\theta_{sym}$ using a plurality of signals, e.g., at different wavelengths and/or at multiple Mueller matrix elements, etc., and statistically (e.g., mean, median, average, etc.) combine the resulting plurality of axes of symmetry to derive a robust symmetrical azimuth angle $\theta_{sym}$ which can be used to determine the azimuth angle offset $\varphi_{off}$.

Once the azimuth angle offset $\varphi_{off}$ is determined based on the POI azimuth angle $\theta_{sym}$, an angular correction (e.g., equal in magnitude and direction of the POI azimuth angle offset $\varphi_{off}$) may be applied to the stage 154 to correct for the POI azimuth angle offset $\varphi_{off}$ when production samples are later loaded and held on the stage 154 for measurement. Typically, each sample will undergo the same deskew process when loaded on the stage 154, e.g., whether the sample is a production wafer or the sample 150, and thus, it is presumed that the angular error $\varphi_S$ between the orientation G of the calibration grating 152 and the stage reference S is approximately the same as the orientation of the microscopic patterns on subsequently loaded samples with respect to the stage reference S at the nominal position on stage 154. Moreover, the angular error $\varphi_{POI}$ between the POI 113 and the stage reference S is constant for the optical metrology device 100. Accordingly, the angular correction based on the azimuth angle offset $\varphi_{off}$ determined using calibration grating 152 may be applied to the stage 154 for subsequently loaded production wafers to approximately correct the azimuth angle offset between the POI 113 and an orientation of the microscopic patterns on each sample when loaded on the stage 154 at a nominal orientation.

Additionally, it may be desirable to use the same sample 150 with calibration grating 152 with different optical metrology devices to determine the POI azimuth angle offset $\varphi_{off}$ for each optical metrology device. The use of the same sample 150 with calibration grating 152 on a fleet of optical metrology devices to correct the POI azimuth angle offset $\varphi_{off}$ provides a uniform calibration of the optical metrology devices.

Referring back to FIG. 1A, the optical metrology device 100 is illustrated as a rotating compensator ellipsometer 100 that performs a diffraction based measurement on the sample 150. The ellipsometer 100 includes a polarization state generator (PSG) 102 and a polarization state detector (PSD) 112. The PSG 102 produces light having a known polarization state and is illustrated as including two broadband light sources 104 and 106, e.g., a Xenon Arc lamp and a Deuterium lamp, respectively, to produce light with a range of 200-1000 nm. A beam splitter 108 combines the light from the light sources 104, 106 and a polarizer 110 produces the known polarization state. It should be understood that additional, different, or fewer light sources may be used if desired. Moreover, if desired, ellipsometer 100 may be monochromatic, with a variable angle of incidence to provide angle resolved measurements.

The PSD 112 includes a polarizing element, referred to as an analyzer 114, a spectrometer 116 and a detector 118, which may be, e.g., a cooled CCD array. The analyzer 114 is illustrated as being coupled to the spectrometer 116 and detector 118 via a fiber optic cable 120. It should be understood that other arrangements are possible, such as directly illuminating the spectrometer 116 from the analyzer 114 without the fiber optic cable 120.

The ellipsometer 100 is illustrated with two rotating compensators 122 and 124 between the PSG 102 and PSD 112. If desired, the ellipsometer 100 may use a single rotating compensator 122 or 124, e.g., between the PSG 102 and the sample 150 or between the sample 150 and the PSD 112, respectively. The ellipsometer 100 may further include focusing elements 126 and 128 before and after the sample 150. The focusing elements may be, e.g., refractive or reflective lenses.

The ellipsometer 100 obliquely illuminates the sample 150, e.g., at a non-zero value of an angle with respect to surface normal the sample 150. For example, the ellipsometer 100 may illuminate the sample 150 at an angle between 50° to 85°, for example at 65°, but other angles may be used if desired. As discussed above, if monochromatic light is used, the angle of incidence may be varied to derive an angle resolved measurement.

FIG. 1A illustrates a greatly exaggerated azimuth angle offset $\varphi_{off}$ between the POI 113 and the orientation of the lines of the calibration grating 152, which is shown in FIG. 1A as aligned with stage translation direction Y. As discussed above, the ellipsometer 100 may intentionally employ different POI azimuth angles θ, e.g., by rotating the stage 154 with respect to the optical system.

As further illustrated in FIG. 1A, the detector 118 is coupled to a computer 130, which includes a processor 132 with memory 134, as well as a user interface including e.g., a display 138 and input devices 140. A computer-usable storage medium 142 having computer-readable program code embodied may be used by the computer 130 for causing the processor to control the ellipsometer 100 and stage 154 to calibrate the azimuth angle offset $\varphi_{off}$, e.g., to measure the azimuth angle offset $\varphi_{off}$ and to apply an angular correction to the stage 154 as described herein. The non-transitory program code for implementing one or more acts described in this detailed description can be implemented by one of ordinary skill in the art in light of the present disclosure and stored, e.g., on a computer readable storage medium 142, which may be any device or medium that can store code and/or data for use by a computer system such as processor 132. The computer-usable storage medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

While a spectroscopic ellipsometer is illustrated in FIG. 1A, it should be understood that the calibration of the azimuth angle offset $\varphi_{off}$ may be applied to other optical metrology devices, including scatterometers, ellipsometers, polarimeters, and reflectometers without any hardware modification. Additionally, it should be understood that while a two-dimensional calibration grating 152 is illustrated in FIG. 1A (and FIGS. 1B-1E), other calibration samples that include one or more mirror symmetry planes may be used, such as a three-dimensional grating, e.g., a grating that is periodic in orthogonal directions. FIG. 2A, by way of example, illustrates a top view of the two-dimensional calibration grating 152 that may be used. As can be seen, the two-dimensional calibration grating 152 is illustrated as including a mirror symmetry plane 162 that is parallel to the direction of the lines in the grating, and another mirror symmetry plane 164 that is perpendicular to the direction of the lines in the grating. Either mirror symmetry plane 162 or 164 may be used in the determination of the azimuth angle offset $\varphi_{off}$. However, due to possible asymmetries in the wall angles of the lines in the calibration grating 152, e.g., there may be tilt in the lines of the calibration grating, it may be advantageous to use the mirror symmetry plane 164 in the determination of the azimuth angle offset $\varphi_{off}$. FIG. 2B illustrates another calibration grating 152' in the determination of the azimuth angle offset $\varphi_{off}$. Calibration grating 152' is a three-dimensional grating, i.e., is periodic in orthogonal directions, and thus, may include mirror symmetry planes 166, 168, 170 and 172, as illustrated in FIG. 2B. Other calibration samples may be used if desired.

In order to find the azimuth angle offset $\varphi_{off}$, the symmetry of the signals produced by the optical metrology device 100 when measuring the calibration grating 152 at different POI azimuth angles θ may be used. The resulting signals with respect to POI azimuth angles θ have a symmetry with respect to the POI azimuth angles θ due the presence of a mirror symmetry plane in the calibration grating 152, e.g., parallel with or perpendicular to the lines in the calibration grating 152 and illustrated as orientation G in FIG. 1B. The azimuth angle offset $\varphi_{off}$ may be identified based on the axis of symmetry of the measured signals measured with respect to different POI azimuth angles θ. By way of example, one type of signals that may be measured over a range of POI azimuth angles θ are one or more Muller matrix elements. For example, the calibration grating 152 may be measured at several azimuth angles θ, e.g., ranging from $-\theta_{AZ}$ to $+\theta_{AZ}$ around a nominal azimuth angle $\theta_0$, 0° or $\theta_0=90°$. For example, at least a partial Muller Matrix may be determined for POI azimuth angles θ between 85° to 95° in one degree increments. If desired, more or fewer POI azimuth angles θ may be used. A partial Mueller Matrix includes less than all of the Mueller Matrix elements.

As the calibration grating 152 is used to calibrate the azimuth angle offset $\varphi_{off}$, the calibration grating 152 should be a good quality to minimize the contribution of the target non-idealities (e.g. roughness and non-uniformity). Some of the target non-idealities can be accessed by measuring the calibration grating 152 at $\theta_{Az}$ and $\theta_{Az}+180°$, e.g., where the spectral difference should be close to white noise.

Ellipsometry typically examines the changes in the p- and s-components of light caused by reflection or transmission from a sample. For example, light having a known polarization state from the PSG 102 is produced and incident on the sample and the resulting change in the polarization state is measured by the PSD 112. The change in polarization state is typically written as follows:

$$R_p = \frac{E'_p}{E_p}; R_s = \frac{E'_s}{E_s}. \quad \text{Eq. 1}$$

In equation 1, $E_p$ and $E_s$ are the electrical vectors for the respective parallel and perpendicular components of the elliptically polarized incident light and $E'_p$ and $E'_s$ are the parallel and perpendicular components, respectively, of the elliptically polarized reflected light, and $R_p$ and $R_s$ are the reflection coefficients of the sample for the parallel and perpendicular components of light. The ellipsometric sample parameters w and A are then conventionally determined as follows:

$$\frac{R_p}{R_s} = \tan \psi e^{i\Delta}. \quad \text{Eq. 2}$$

Conventionally, a diffraction based measurement of a sample is based on the spectral response of the scattered light to the structure of the sample. The response is typically measured ellipsometrically by monitoring the change in $\psi$ (the ratio of $R_p/R_s$) and $\Delta$ (phase difference between $R_p$ and $R_s$).

The Mueller Matrix M is a 4×4 matrix that describes the sample being measured and is related to the Jones matrix J as follows:

$$M = TJ \otimes J^* T^{-1} \quad \text{Eq. 3}$$

The Jones matrix describes the sample-light interaction as follows:

$$J = \begin{pmatrix} r_{ss} & r_{sp} \\ r_{ps} & r_{pp} \end{pmatrix} \quad \text{Eq. 4}$$

$$\begin{pmatrix} E'_s \\ E'_p \end{pmatrix} = \begin{pmatrix} r_{ss} & r_{sp} \\ r_{ps} & r_{pp} \end{pmatrix} \begin{pmatrix} E_s \\ E_p \end{pmatrix}. \quad \text{Eq. 5}$$

The Jones matrix depends on the angle of incidence, azimuth, wavelength as well as structural details of the sample. The diagonal elements describe the complex reflectance (amplitude & phase) for polarization orthogonal ($r_{ss}$) and parallel ($r_{pp}$) to the plane incidence defined by the illumination and collection arms. The off-diagonal terms $r_{sp}$ and $r_{pp}$ are related to polarization conversion between s and p polarization states in the presence of sample anisotropy. The Jones matrix J elements, however, are not easily obtained experimentally. The elements of the 4×4 Mueller Matrix, however, can be derived experimentally.

The matrix T in equation 3 is used to construct the 4×4 Mueller matrix from the Jones matrix and is given by:

$$T = \begin{pmatrix} 1 & 0 & 0 & 1 \\ 1 & 0 & 0 & -1 \\ 0 & 1 & 1 & 0 \\ 0 & i & -i & 0 \end{pmatrix}. \quad \text{Eq. 6}$$

The definition of Kronecker product:

$$\begin{pmatrix} a_{11} & a_{12} \\ a_{21} & a_{22} \end{pmatrix} \otimes \begin{pmatrix} b_{11} & b_{12} \\ b_{21} & b_{22} \end{pmatrix} = \begin{pmatrix} a_{11}b_{11} & a_{11}b_{12} & a_{12}b_{11} & a_{12}b_{12} \\ a_{11}b_{21} & a_{11}b_{22} & a_{12}b_{21} & a_{12}b_{22} \\ a_{21}b_{11} & a_{21}b_{12} & a_{22}b_{11} & a_{22}b_{12} \\ a_{21}b_{21} & a_{21}b_{22} & a_{22}b_{21} & a_{22}b_{22} \end{pmatrix}. \quad \text{Eq. 7}$$

Figures 3, 4:
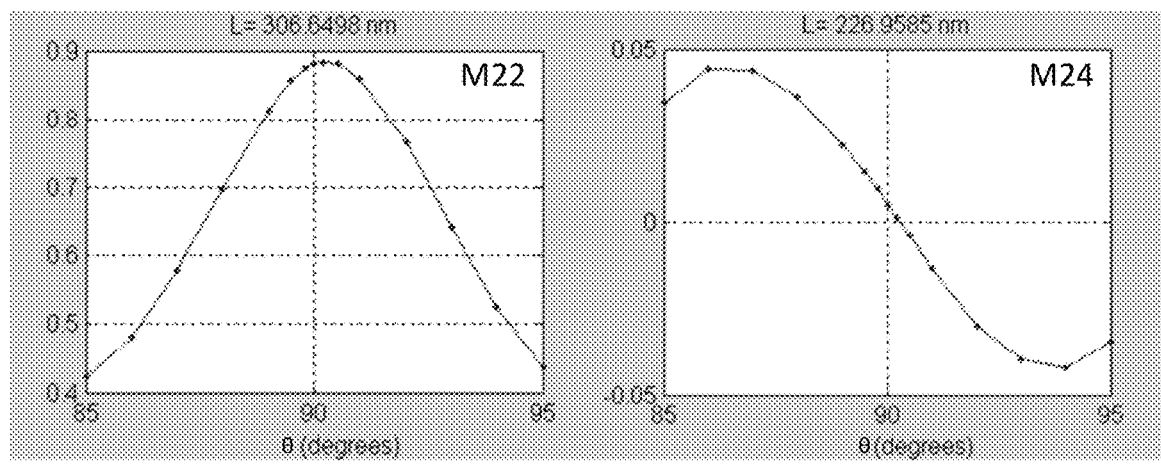
FIG. 3, by way of example, illustrates the 4×4 Muller Matrix (MM) elements and illustrates the symmetric and antisymmetric properties of the different Mueller Matrix elements around the mirror symmetry plane in a calibration grating.
FIG. 4 illustrates examples of the symmetries for Mueller Matrix elements.

As discussed above, the natural symmetry of the Mueller Matrix elements around the mirror symmetry plane of the calibration grating 152 may be used to determine the azimuth angle offset $\varphi_{off}$. FIG. 3, by way of example, illustrates the 4×4 Muller Matrix (MM) elements and illustrates the symmetric and antisymmetric properties of the different Mueller Matrix elements around the mirror symmetry plane in the calibration grating 152. FIG. 4 illustrates the symmetries for Mueller matrix elements M22 and M24 between azimuthal angles θ between 85° to 95° for the same target grating at different wavelengths (306.6498 nm and 226.9585 nm, respectively).

Figure 5:
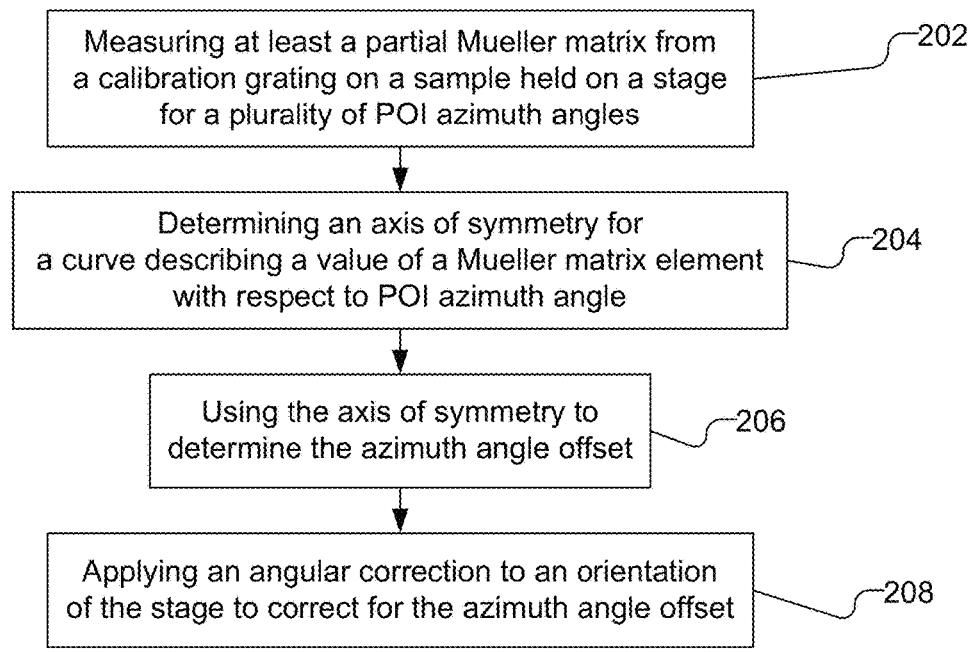
FIG. 5 is a flow chart illustrating a method of calibration of an azimuth angle offset between a plane-of-incidence (POI) of an optical system of an optical metrology tool and an orientation of a calibration grating when loaded on a stage at a nominal orientation.

FIG. 5 is a flow chart illustrating a method of calibration of an azimuth angle offset between a plane-of-incidence (POI) of an optical system of an optical metrology tool and an orientation of a calibration grating when loaded on a stage at a nominal orientation. The nominal orientation, e.g., may be an initial orientation of the calibration grating with respect to the POI when the sample is initially loaded on the stage. As illustrated, at least a partial Mueller matrix is measured from a calibration grating on the sample held on the stage for a plurality of POI azimuth angles (202). The at least partial Mueller matrix may be measured using, e.g., an ellipsometer, a spectroscopic ellipsometer, a scatterometer, a polarimeter, or a reflectometer. The POI azimuth angles may range from $-\theta_{Az}$ to $+\theta_{Az}$ around a nominal POI azimuth angle $\theta_0=0°$ or $\theta_0=90°$, and may include two or more POI azimuth angles, and in one implementation, fifteen or fewer POI azimuth angles may be used, and in particular ten or fewer POI azimuth angles may be used. An axis of symmetry is determined for a curve describing a value of a Mueller matrix element with respect to POI azimuth angle (204). The axis of symmetry is used to determine the azimuth angle offset (206). For example, the axis of symmetry may be used alone or in combination with other axes of symmetry to determine the symmetrical azimuth angle, and the azimuth angle offset may be determined from the symmetrical azimuth angle and, if desired, the nominal POI azimuth angle, e.g., as a difference between the symmetrical azimuth angle and a nominal POI azimuth angle. Once the azimuth angle offset is determined, an angular correction may be applied to an orientation of the stage to correct for the azimuth angle offset (208).

While it is possible to determine the azimuth angle offset using a single Mueller matrix element and a single wavelength (e.g., where the determined axis of symmetry would correspond to the POI azimuth angle), it may be desirable to use multiple wavelengths and/or Mueller matrix elements. Thus, if desired, the at least partial Mueller matrix may be measured for a plurality of wavelengths, wherein axes of symmetry are determined for curves describing the value of the Mueller matrix element in each wavelength of the plurality of wavelengths, and the axes of symmetry are used to determine the azimuth angle offset. Additionally, if desired, a number of Mueller matrix elements may be used. In other words, axes of symmetry are determined for a plurality of curves describing values of different Mueller matrix elements with respect to azimuth angle, and the axes of symmetry are used to determine the azimuth angle offset. The axes of symmetry may be used to determine the azimuth angle offset, e.g., by combining the axes of symmetry, e.g., as a mean, median or an average, to determine a symmetrical azimuth angle and subtracting the nominal POI azimuth angle $\theta_0$ from the symmetrical azimuth angle.

Figure 6:
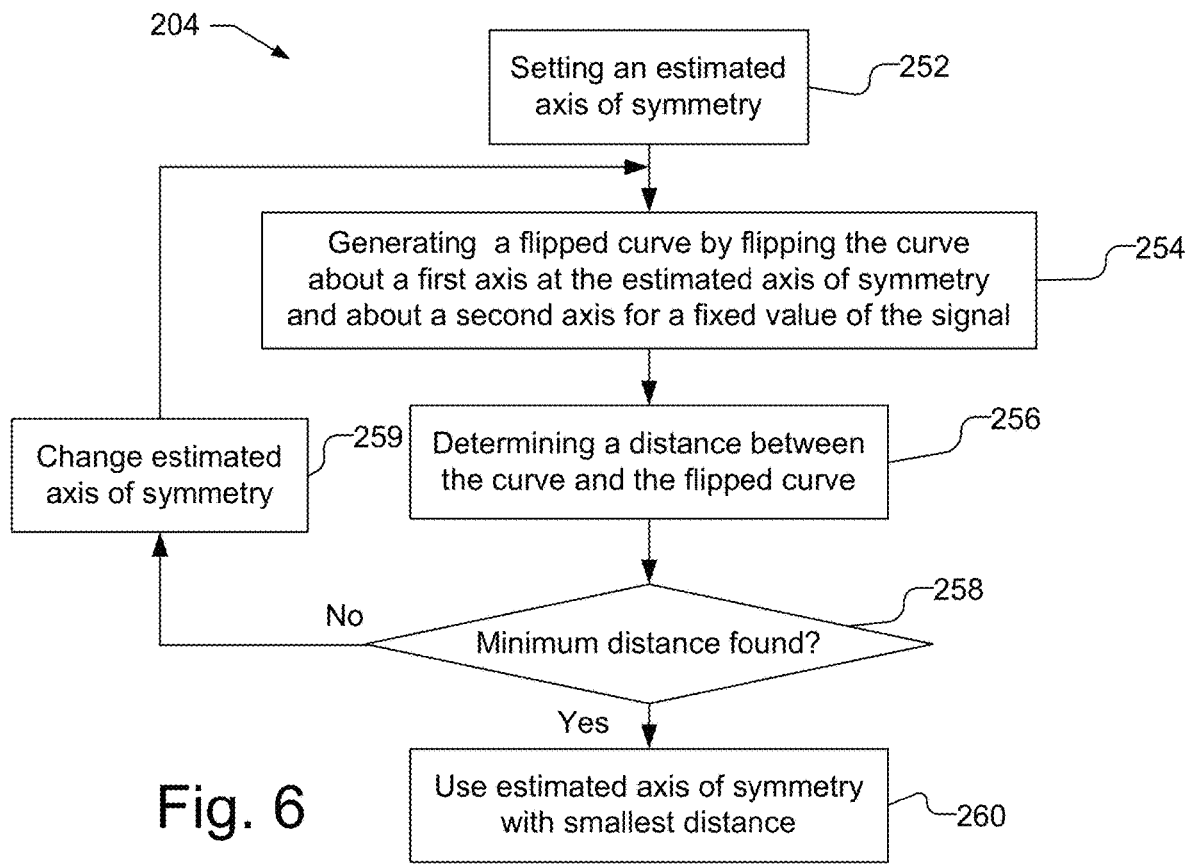
FIG. 6 illustrates a method of determining an axis of symmetry for a curve.

FIG. 6 illustrates a method of determining an axis of symmetry for a curve, such as that describing the value of the Mueller matrix element with respect to azimuth angle from (204) in FIG. 5. As illustrated, the axis of symmetry for a curve may be determined recursively by flipping the curve with different estimated axes of symmetry and comparing the distance between the curve and the resulting flipped curve, where the estimated axis of symmetry that corresponds to the smallest distance is used as the axis of symmetry. As illustrated in FIG. 6, an estimated axis of symmetry is set (252). The initial estimated axis of symmetry may be based an assumption that there are no angular errors, i.e., the estimated axis of symmetry may be the nominal POI azimuth angle $\theta_0$. A flipped curve is generated by flipping the curve about a first axis at the estimated axis of symmetry and about a second axis, which is orthogonal to the first axis, at a fixed value for the signal (254), e.g., at a fixed value of the Mueller matrix element. A distance between the curve and the flipped curve is determined (256). For example, the distance between the curve and the flipped curve may be determined using a Mean Square Error (MSE) of the distances in a direction parallel to the first axis between a first curve and points on a second curve, wherein the first curve and the second curve are different ones of the curve and the flipped curve. The process may be repeated (258) and the estimated axis of symmetry is changed (259) until a minimum distance if found (258). For example, an optimization process, such as the Newton method of optimization or Gauss-Newton algorithm, may be used to find a minimum distance, at which point no further estimates of the axis of symmetry are necessary. Alternatively, a specific number of iterations with a specific amount of change for each estimated axis of symmetry may be used. The estimated axis of symmetry associated with the smallest distance is used as the axis of symmetry (260).

Figure 7:
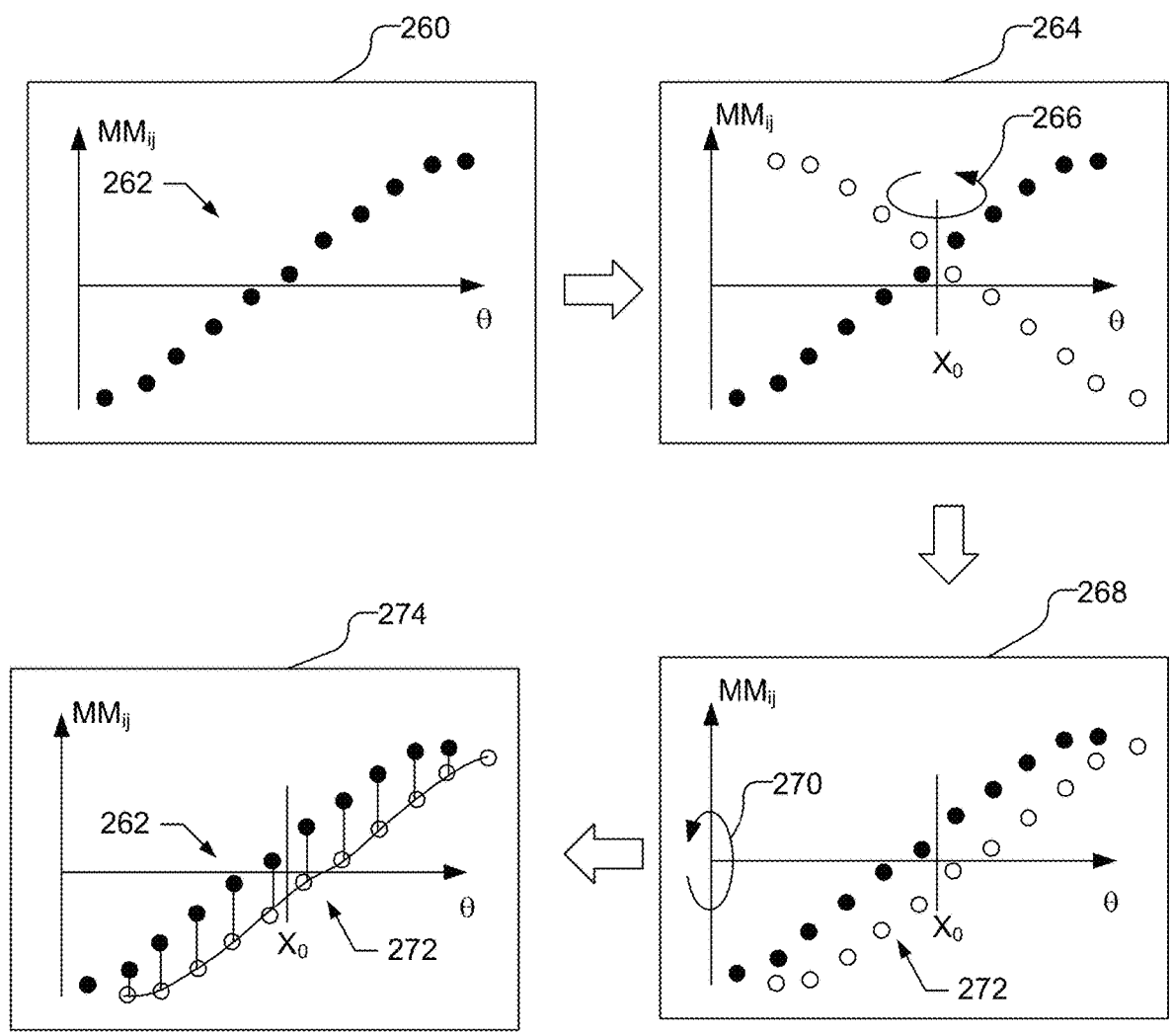
FIG. 7 graphically illustrates determining an axis of symmetry for a curve as described in FIG. 6.

FIG. 7, by way of example, graphically illustrates determining an axis of symmetry for a curve as described in FIG. 6, for a single wavelength and a single Mueller matrix element. The process illustrated in FIG. 7 may be performed separately for each desired wavelength in each desired Mueller matrix element. Graph 260 illustrates the experimentally obtained values of the Mueller matrix element ($MM_{kj}$) with respect to azimuth angle ($\theta$), illustrated with black spots, that form a curve 262. It should be noted that the sampling of azimuth angles $\theta$ should be small enough to avoid missing "features" of the curve $MM(\theta)$. As illustrated by arrow 266 in graph 264, the curve is flipped about a first axis at an estimated axis of symmetry $X_0$, resulting in a second set of data points, illustrated with white spots. As illustrated by arrow 270 in graph 268, the curve is also flipped about a second axis, which is orthogonal to the first axis, at a fixed value for the Mueller matrix element, e.g., 0, but other values may be used, resulting in a flipped curve 272. As illustrated in graph 274, the distance between the curve 262 and the flipped curve 272 can then be determined. The distance may be determined, e.g., as the MSE, as illustrated in equation 8 below, of the distances between the experimental data points (exp) from curve 262 and the flipped curve (272), which may be produced using spline interpolation. As can be seen, the distance is determined in the direction of the first axis shown in graph 264, as indicated by the black bars in graph 274.

$$F = \Sigma(\exp - \text{spline})^2 \qquad \text{Eq. 8}$$

An optimization process is used, in which the curve 262 is flipped at different estimated axes of symmetry $X_0$ and the distances between the curve 262 and the resulting flipped curve 272, as illustrated below, until a minimum distance is found. The estimated axis of symmetry $X_0$ that provides the minimum distance is defined as the axis of symmetry ($\theta_{sym}$).

$$\theta_{sym} = \arg \min_{X_0} F(X_0) \qquad \text{Eq. 9}$$

Figure 8:
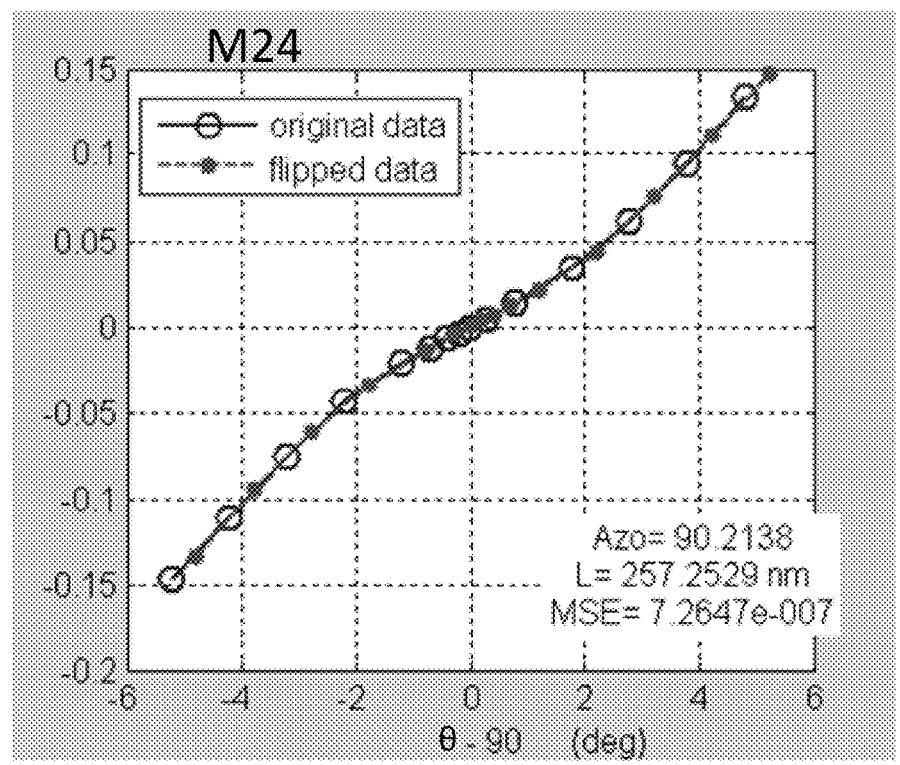
FIG. 8 illustrates experimental output for the determination of the axis of symmetry for a Mueller matrix element at a single wavelength for a target grating.

FIG. 8, by way of example, illustrates experimental output for the determination of the axis of symmetry for Mueller matrix element $MM_{24}$ for a wavelength of 257.2529 nm for a target grating, in which the axis of symmetry $\theta_{sym}$ is determined to be 90.2138° with a MSE of 7.2657e-007.

Figure 9:
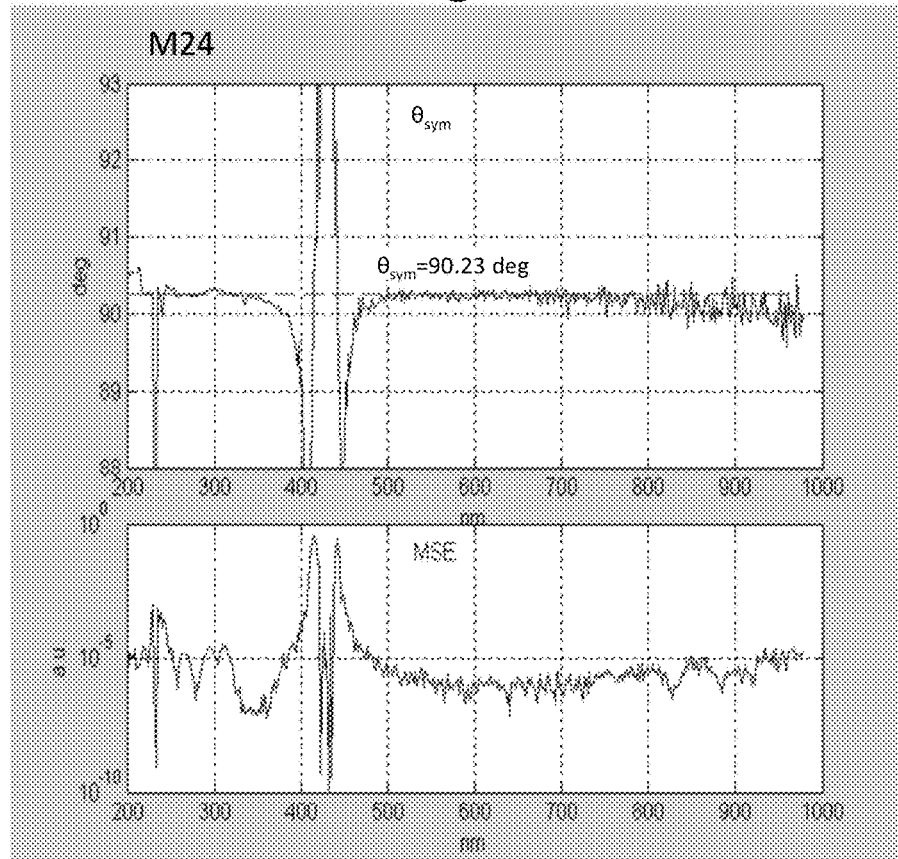
FIG. 9 illustrates determined axes of symmetry plotted with respect to wavelengths for a single Mueller matrix element, and illustrates the corresponding Mean Square Error (MSE) for each wavelength.

As discussed above, an axis of symmetry may be determined for each desired wavelength in each Mueller matrix element. FIG. 9, by way of example, illustrates determined axes of symmetry $\theta_{sym}$ (in degrees) plotted with respect to wavelengths for a single Mueller matrix element, and illustrates the corresponding MSE for each wavelength. As can be seen, a large number of data points $\theta_{sym}(ij, \lambda)$, where "ij" denotes the element $MM_{ij}$ of the Mueller matrix and $\lambda$ denotes the wavelength, are not clearly symmetric (or anti-symmetric) due to low sensitivity of Mueller matrix to the azimuth $\theta$ or due to tool/sample non-idealities.

Accordingly, a series of filters may be used to remove any axis of symmetry that is not symmetric due to low sensitivity. For example, the axes of symmetry may be filtered before using the axes of symmetry to determine the azimuth angle offset, wherein filtering removes any axis of symmetry that corresponds to a wavelength having sensitivity to the azimuth angle below a threshold. In other words, a filter may be used to ensure the sensitivity of the Mueller matrix element with respect to azimuth angle $\theta$ at a particular wavelength $\lambda$ is sufficiently high, i.e., the data point $\theta_{sym}(ij, \lambda)$ is produced with data (values of Mueller matrix element with respect to azimuth angel $\theta$) with a range that is higher than a given threshold, e.g., greater than 0.05. For example, the particular data point $\theta_{sym}(ij, \lambda)$, produced in FIG. 8, i.e., 90.2138, is produced using a range of data that varies from −0.15 to 0.14 (i.e., a range of 0.29).

Another example of a filter removes any axis of symmetry that corresponds to a wavelength having a MSE that is greater than threshold. In other words, the final MSE from the fitting of $X_0$, as discussed above, that corresponds to a data point $\theta_{sym}(ij, \lambda)$ that is to be retained must be sufficiently small, i.e., below a threshold such as 2E-5. Thus, as illustrated in FIG. 9, data point $\theta_{sym}(ij, \lambda)$ with wavelengths $\lambda$ having corresponding MSE values greater than 2E-5 will be filtered out.

Another filter that may be used is based on wavelength range. For example, it can be seen that data points $\theta_{sym}(ij, \lambda)$ in the deep ultra-violet (DUV) and near infra-red (NIR) are noisy and thus may be excluded. Accordingly, data points $\theta_{sym}(ij, \lambda)$ with a wavelength range of, e.g., 300-800 nm, may be retained.

Another filter that may be used is based on the number of fitting points used during the optimization of $X_0$, discussed above. For example, as can be seen in graph 274 in FIG. 7, 10 out of 11 experimental points on curve 262 were used to find the distance between the flipped curve 272 and the curve 262. If the number of fitting points is too low, the resulting optimization of $X_0$ is unreliable and should be disregarded. The minimum number of fitting points required is a function of the total number of points available, but may be, e.g., approximately 33% of the total number of points available.

After applying the previous filters to the set of all $\theta_{sym}$ data points, e.g., from the different MM elements ij and different wavelengths λ (noted as $\{\theta_{sym}\}_{all}$), the remaining data points (noted $\{\theta_{sym}\}_{filtered}$) may include some flyers, i.e., atypical values when compared to the mean value. Additional filters may be used to eliminate any remaining flyers that were not removed by the preceding filters. Such flyers can be removed, e.g., by calculating a median value of $\{\theta_{sym}\}_{filtered}$ (noted as Median_$\theta_{sym}$) and calculating the standard deviation of $\{\theta_{sym}\}_{filtered}$ (noted as Stdev_$\theta_{sym}$), and for each point $\theta_{sym}$ from $\{\theta_{sym}\}_{filtered}$ calculating a ratio ($\theta_{sym}$−Median_$\theta_{sym}$)/Stdev_$\theta_{sym}$ (noted as Err_Sigma_Ratio), and removing from $\{\theta_{sym}\}_{filtered}$ all data points presenting an Err_Sigma_Ratio that is greater than a threshold, e.g., 3.

Figure 10:
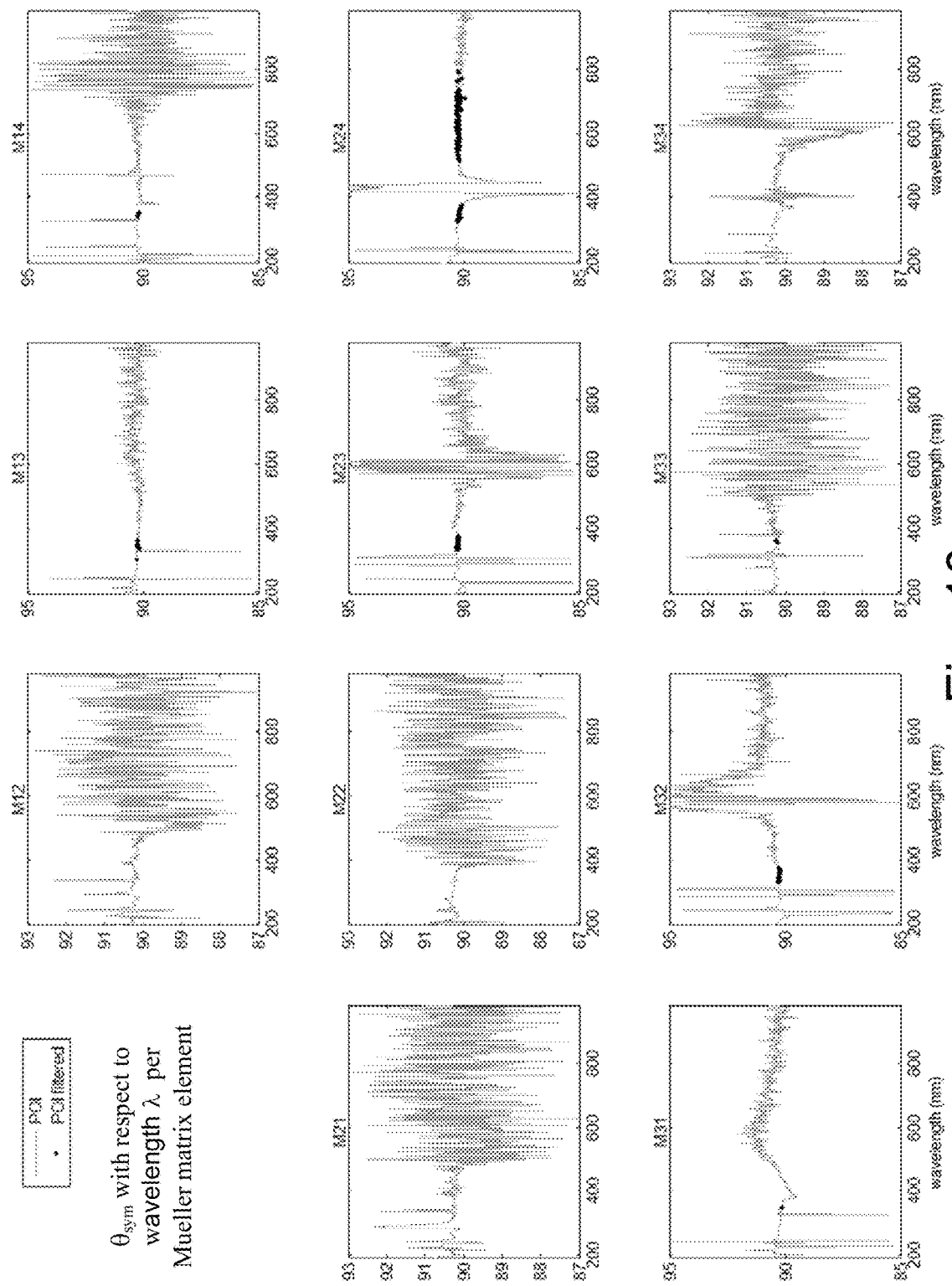
FIG. 10 illustrates experimental output for the determination of the axis of symmetry for a Mueller matrix at a plurality of wavelengths after being filtered.

FIG. 10, by way of example, illustrates experimental output for the determination of the axis of symmetry $\theta_{sym}$ for a Mueller matrix at a plurality of wavelengths after being filtered as discussed above. The azimuth angle offset $\theta_{off}$ may be determined using a combination of the remaining data points $\theta_{sym}$(ij, λ), e.g., a mean, median or average to produce a symmetrical azimuth angle. For the example illustrated in FIG. 10, the symmetrical azimuth angle is determined as a median($\theta_{sym}$)=90.239° with a precision of ~0.003° and an accuracy ~0.025°. Thus, with a nominal POI azimuth angle $\theta_0$ of 90°, the azimuth angle offset may be determined to be 0.239°. Using the illustrated calibration of the azimuth angle offset, an azimuth error maybe detected down to less than 0.02°. For a fleet of optical metrology systems, each corrected by the above-described method, a significant benefit of spectra-level matching is present.

Figure 11:
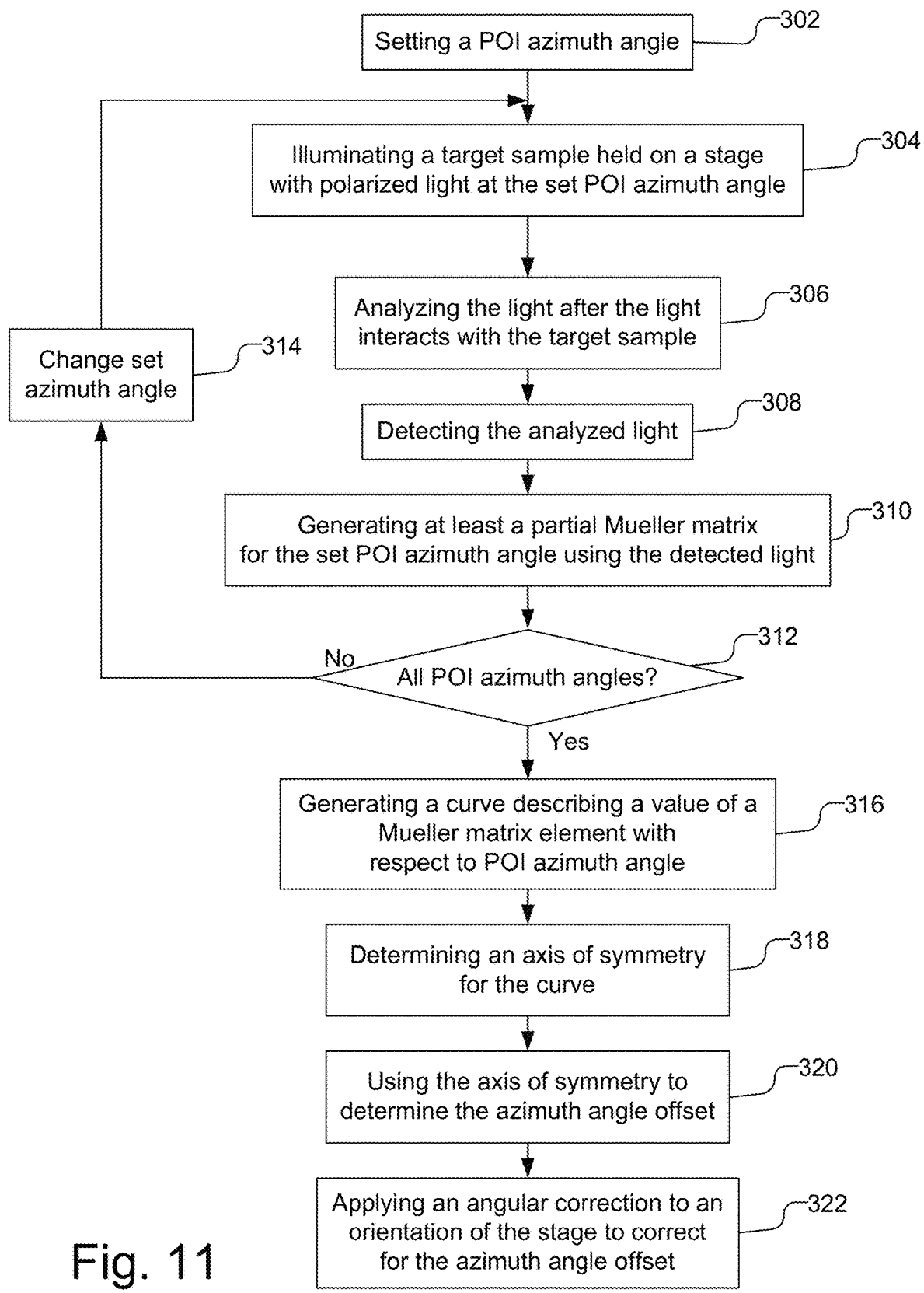
FIG. 11 is another flow chart illustrating a method of calibration for an azimuth angle offset in a plane-of-incidence (POI) azimuth of an optical metrology tool with respect to a stage reference on a stage.

FIG. 11 is another flow chart illustrating a method of calibration of an azimuth angle offset between a plane-of-incidence (POI) of an optical system of an optical metrology tool and an orientation of a calibration grating on a sample at a nominal orientation with respect to the POI. As illustrated, a POI azimuth angle is set (302). The calibration grating on a sample that is held on a stage is illuminated with polarized light at the set POI azimuth angle (304). The light is analyzed after the light interacts with the calibration grating (306) and the analyzed light is detected (308). At least a partial Mueller matrix is generated for the POI azimuth angle using the detected light (310). The process repeats for different POI azimuth angles (314) until all desired POI azimuth angles have been set (312). The POI azimuth angles used may range from −$\theta_{AZ}$ to +$\theta_{AZ}$ around a nominal POI azimuth angle $\theta_0$=0° or $\theta_0$=90°. For example, fifteen or fewer different POI azimuth angles may be used, which may be concentrated near the center azimuth angle, e.g., $\theta_0$=0° or $\theta_0$=90°. A curve describing a value of a Mueller matrix element with respect to POI azimuth angle is generated (316). An axis of symmetry for the curve is determined (318), e.g., as discussed above, and the resulting axis of symmetry is used to determine the azimuth angle offset (320). For example, as discussed above, nominal POI azimuth angle $\theta_0$ may be subtracted from the axis of symmetry (or a combination of axes of symmetry) to determine the azimuth angle offset $\theta_{off}$. An angular correction may be applied to an orientation of the stage to correct for the azimuth angle offset (322).

As discussed above, it is possible to determine the azimuth angle offset using a single Mueller matrix element and a single wavelength (e.g., where the determined axis of symmetry would correspond to the azimuth angle offset), nevertheless, it may be desirable to use multiple wavelengths and/or Mueller matrix elements. Thus, the calibration grating may be illuminated in (304) at a plurality of wavelengths, wherein the at least the partial Mueller matrix is for the plurality of wavelengths; wherein a curve and an axis of symmetry is determined for each of the plurality of wavelengths to produce a plurality of axes of symmetry for the Mueller matrix element. Further, a curve and an axis of symmetry may be generated for different Mueller matrix elements to produce a plurality of axes of symmetry for the different Mueller matrix elements. The axes of symmetry may be used to determine the azimuth angle offset by determining a symmetrical azimuth angle as a mean, median or an average of the axes of symmetry and using the symmetrical azimuth angle and the nominal POI azimuth angle to determine the azimuth angle offset.

Moreover, as discussed above, filters may be applied to data points $\theta_{sym}$(ij, λ) that are not clearly symmetric (or anti-symmetric) due to low sensitivity of Mueller matrix to the azimuth θ or due to tool/sample non-idealities.

Figure 12:
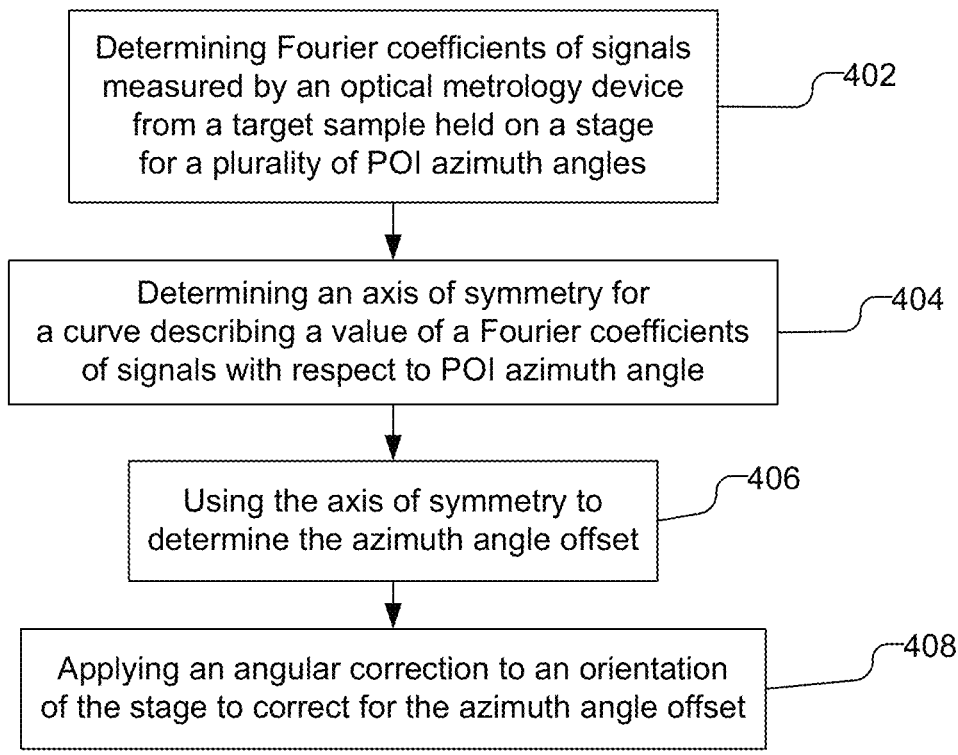
FIG. 12 is another flow chart illustrating a method of calibration for an azimuth angle offset in an optical metrology tool using Fourier coefficients of a signal measured with the optical metrology device.

It should be understood that other signals, rather than only Mueller matrix elements, may be used to calibrate the azimuth angle offset. For example, a Fourier analysis of signals measured by the metrology device 100 at different POI azimuth angles θ, may be used to produce Fourier coefficients as a function of POI azimuth angles θ, and an axis of symmetry of the Fourier coefficients may be found in order to determine the POI azimuth angle offset $\varphi_{off}$. FIG. 12, by way of example, is a flow chart illustrating a method of calibration of an azimuth angle offset by finding an axis of symmetry of Fourier coefficient of signals measured by the metrology device. As illustrated, Fourier coefficients are determined from signals measured by an optical metrology device from a calibration grating on a sample held on a stage for plurality of POI azimuth angles (402). The signals may be measured using, e.g., an ellipsometer, a spectroscopic ellipsometer, a scatterometer, a polarimeter, or a reflectometer. The signals may be, e.g., any desired raw signals, such as intensity signals, Mueller matrix elements (which may be normalized to M11 or not, as the symmetries do not change), periodic signals arising from optical modulation in the measurement system, such as a rotating compensator, a response function that is derivable from Mueller matrix elements, such as psi, delta, N, C, S, any polarized reflectance, where in the case with a diagonal Jones matrix, N=−M12=−M21=cos(2*ψ), C=M33=M44=sin(2*ψ)cos(Δ), and S=M34=−M43=sin(2*ψ)sin(Δ), and for cases with a non-diagonal Jones matrix, NCS (and ψ/Δ) are sometimes used, but their definition depends on the measuring system. There are a number of measured quantities that can be used instead of the Mueller matrix elements, which may be derivable from the unnormalized Mueller matrix, but it may not be required to determine any particular Mueller matrix element to measure. For instance, p-polarized intensity reflectance $R_p$=M11+M12. The value of $R_p$ is readily measured without having to measure either M11 or M12. Since M11 and M12 are both even functions of azimuth angle about the symmetry point, $R_p$(θ) can be used to determine the azimuth angle offset. Further, since the input beam does not change with azimuth angle, the symmetry even holds if the intensity of the input beam is unknown, so $I_p$(θ) could be used to find the offset as well.

The Fourier coefficients describe the periodicity of the signals as a function of POI azimuth angle. An axis of symmetry is determined for a curve describing the Fourier coefficients with respect to POI azimuth angle (404). The axis of symmetry may be determined, e.g., in a manner similar to that described in FIGS. 6 and 7, or using Fourier coefficients describing periodicity of any measured quantity due to azimuth rotation as discussed below. The axis of symmetry is used to determine the azimuth angle offset (406), which may be performed in a manner discussed above. For example, the axis of symmetry may be used alone or in combination with other axes of symmetry (e.g., produced by multiple wavelengths) to determine the symmetrical azimuth angle, and the azimuth angle offset may be determined from the symmetrical azimuth angle and the nominal POI azimuth angle, e.g., as a difference between the symmetrical azimuth angle and the nominal POI azimuth angle. A mean, median or average of the axes of symmetry determined for each wavelength may be used to determine the symmetrical azimuth angle and the symmetrical azimuth angle used with the nominal POI azimuth angle to determine the azimuth angle offset. Moreover, a filtering process, similar to that discussed above, may be used to remove particular wavelengths from the data set, e.g., wavelengths having a sensitivity to the azimuth angle that is below a threshold or any axis of symmetry that corresponds to a wavelength having a Mean Square Error of distances that is greater than a second threshold. Once the azimuth angle offset is determined, an angular correction may be applied to an orientation of the stage to correct for the azimuth angle offset (408).

Figure 13:
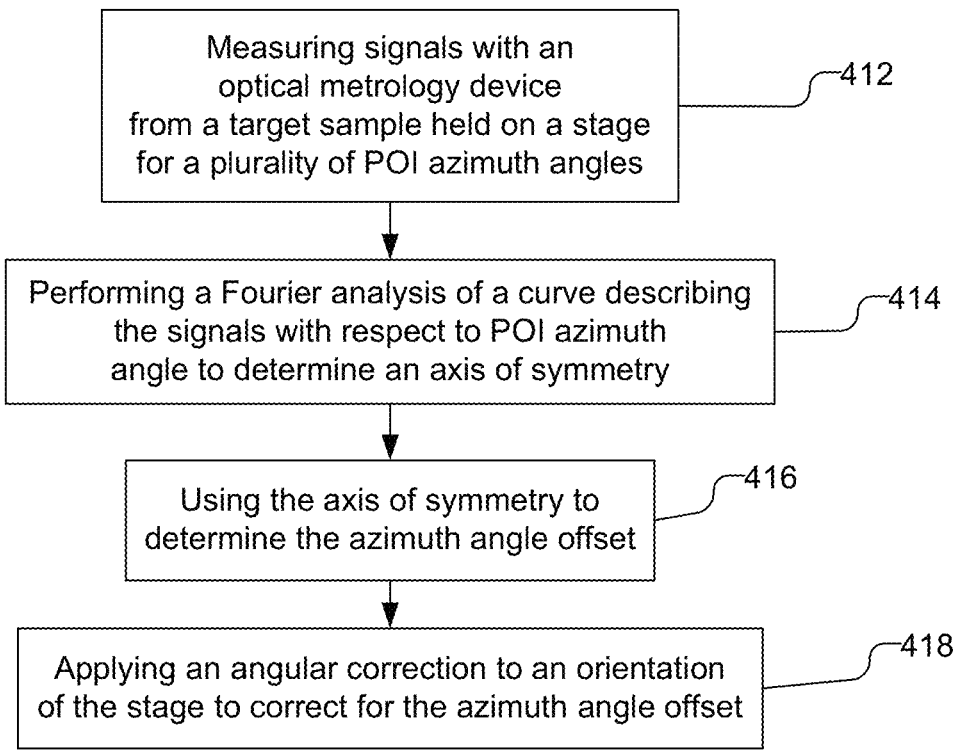
FIG. 13 is another flow chart illustrating a method of calibration for an azimuth angle offset in an optical metrology tool by finding an axis of symmetry of signals using a Fourier analysis.

Additionally, if desired, a Fourier analysis may be used to determine the axis of symmetry. Thus, signals measured by the metrology device 100 as a function of the POI azimuth angles θ may be produced, and a Fourier analysis used to determine the axis of symmetry of a curve that describes the signals as a function of POI azimuth angles θ to determine the POI azimuth angle offset $\varphi_{off}$. FIG. 13, by way of example, is a flow chart illustrating a method of calibration of an azimuth angle offset by finding an axis of symmetry of signals using a Fourier analysis. As illustrated, signals are measured by an optical metrology device from a calibration grating on a sample held on a stage for plurality of POI azimuth angles (412). The signals may be measured using, e.g., an ellipsometer, a spectroscopic ellipsometer, a scatterometer, a polarimeter, or a reflectometer. The signals may be, e.g., any desired raw signals, such as intensity signals, Mueller matrix elements (which may be normalized to M11 or not, as the symmetries do not change), Fourier coefficients of periodic signals, etc. The plurality of azimuth angles θ of the signals measured may be, e.g., a limited range, a full rotation or half rotation, e.g., 360° or 180°. A Fourier analysis is performed on a curve describing the signals with respect to the POI azimuth angle to determine an axis of symmetry (414). The axis of symmetry is used to determine the azimuth angle offset (416), which may be performed in a manner discussed above. For example, the axis of symmetry may be used alone or in combination with other axes of symmetry (e.g., produced by multiple wavelengths) to determine the symmetrical azimuth angle, and the azimuth angle offset may be determined from the symmetrical azimuth angle and the nominal POI azimuth angle, e.g., as a difference between the symmetrical azimuth angle and the nominal POI azimuth angle. A mean, median or average of the axes of symmetry determined for each wavelength may be used to determine the symmetrical azimuth angle and the symmetrical azimuth angle used with the nominal POI azimuth angle to determine the azimuth angle offset. Moreover, a filtering process, similar to that discussed above, may be used to remove particular signals from the data set, e.g., wavelengths having a sensitivity to the azimuth angle that is below a threshold or any axis of symmetry that corresponds to a wavelength having a Mean Square Error of distances that is greater than a second threshold. Once the azimuth angle offset is determined, an angular correction may be applied to an orientation of the stage to correct for the azimuth angle offset (418).

Figure 14:
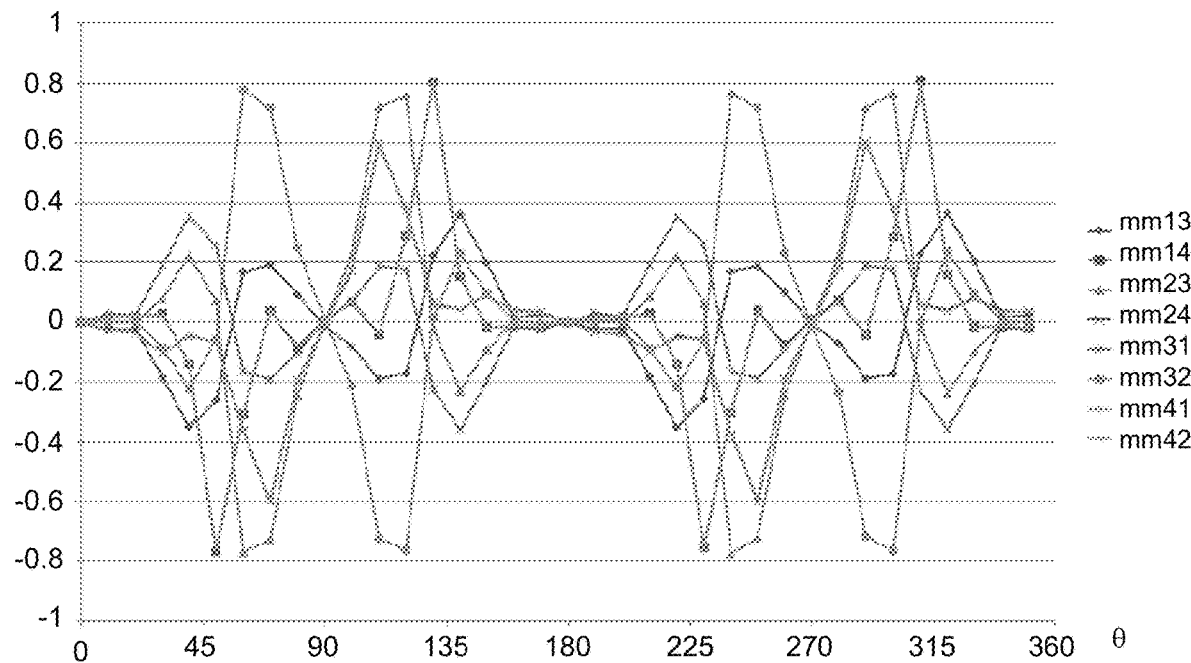
FIGS. 14 and 15 illustrate two types of Mueller response for two-dimensional gratings with azimuth periodicity of 180°.
Figure 15:
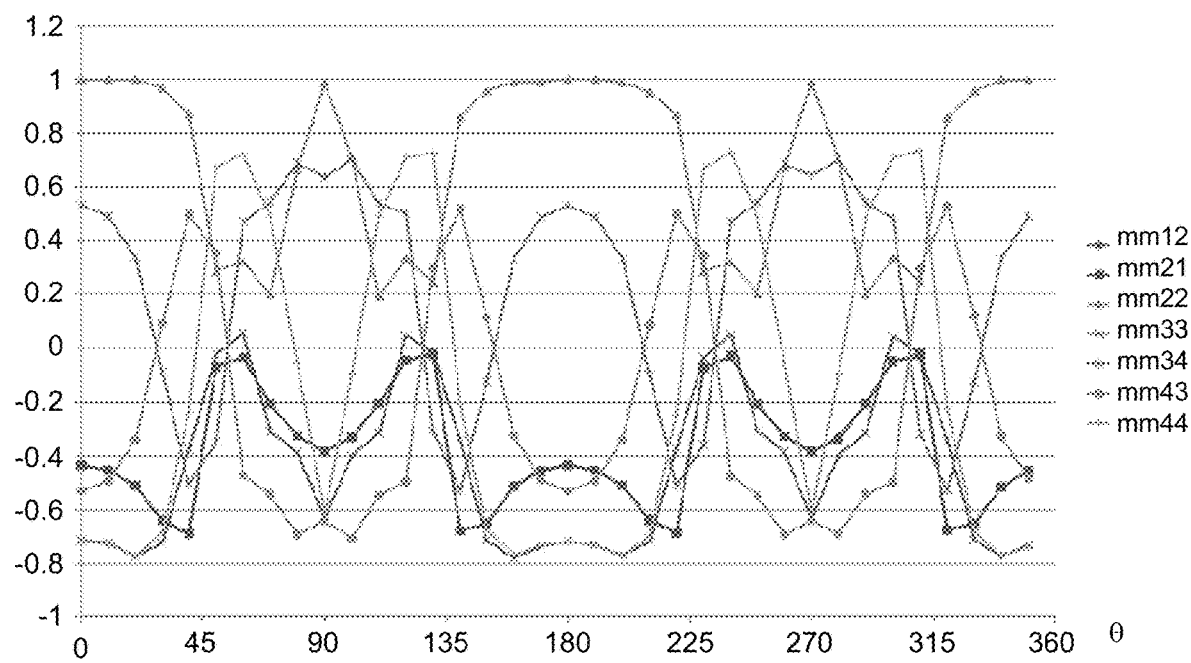

FIGS. 14 and 15, by way of example, illustrate two types of Mueller response for two-dimensional gratings with azimuth periodicity of 180°. FIG. 14 illustrates off-diagonal Mueller matrix elements, e.g., the antisymmetric Muller matrix elements shown in FIG. 3, while FIG. 15 illustrates the on-diagonal Mueller matrix elements, e.g., the symmetric Mueller matrix elements shown in FIG. 3. As can be seen, each Mueller matrix element $MM_{ij}$ is periodic with the azimuth angle θ, which can be represented by a Fourier series:

$$MM_{ijk}(\theta) = \alpha_{ij0} + \sum_{k=1}^{K} [\alpha_{ijk} \cos(k\theta) + \beta_{ijk} \sin(k\theta)] \quad \text{Eq. 10}$$

$$= \alpha_{ij0} + \sum_{k=1}^{K} \left\{ \sqrt{\alpha_{ijk}^2 + \beta_{ijk}^2} \cos\left[\left(k\theta - \tan^{-1}\frac{\beta_{ijk}}{\alpha_{ijk}}\right)\right]\right\}$$

The coefficients may be calculated from the Mueller matrix elements as follows:

$$\alpha_{ijk} = \frac{2}{N}\sum_{n=0}^{N-1} MM_{ij}\left(\frac{2\pi n}{N}\right)\cos\left(\frac{2\pi n}{N}\right) \quad \text{Eq. 11}$$

$$\beta_{ijk} = \frac{2}{N}\sum_{n=0}^{N-1} MM_{ij}\left(\frac{2\pi n}{N}\right)\sin\left(\frac{2\pi n}{N}\right)$$

The off-diagonal Mueller matrix elements, shown in FIG. 14, have slopes with opposite signs at 0° and 90°, and have odd symmetry about a two-dimensional pattern alignment angle, which can be analyzed using a sine series as follows to determine the POI azimuth angle offset $\varphi_{off,ijk}$ for each Mueller matrix element $MM_{ij}$:

$$\varphi_{off,ijk} = \frac{1}{k}\left[\tan^{-1}\left(\frac{\beta_{ijk}}{\alpha_{ijk}}\right) \pm \frac{\pi}{2}\right] \quad \text{Eq. 12}$$

The on-diagonal Mueller matrix elements, shown in FIG. 15, have extrema at 0° and 90°, with an even symmetry about a two-dimensional pattern alignment angle, and can be analyzed using a cosine series as follows to determine the POI azimuth angle offset $\varphi_{off,ijk}$:

$$\varphi_{off,ijk} = \frac{1}{k}\tan^{-1}\left(\frac{\beta_{ijk}}{\alpha_{ijk}}\right) \quad \text{Eq. 13}$$

Thus, a Fourier series analysis of the Mueller matrix elements may be used to determine the axis of symmetry, and thus, POI azimuth angle offset $\varphi_{off}$.

Figure 16:
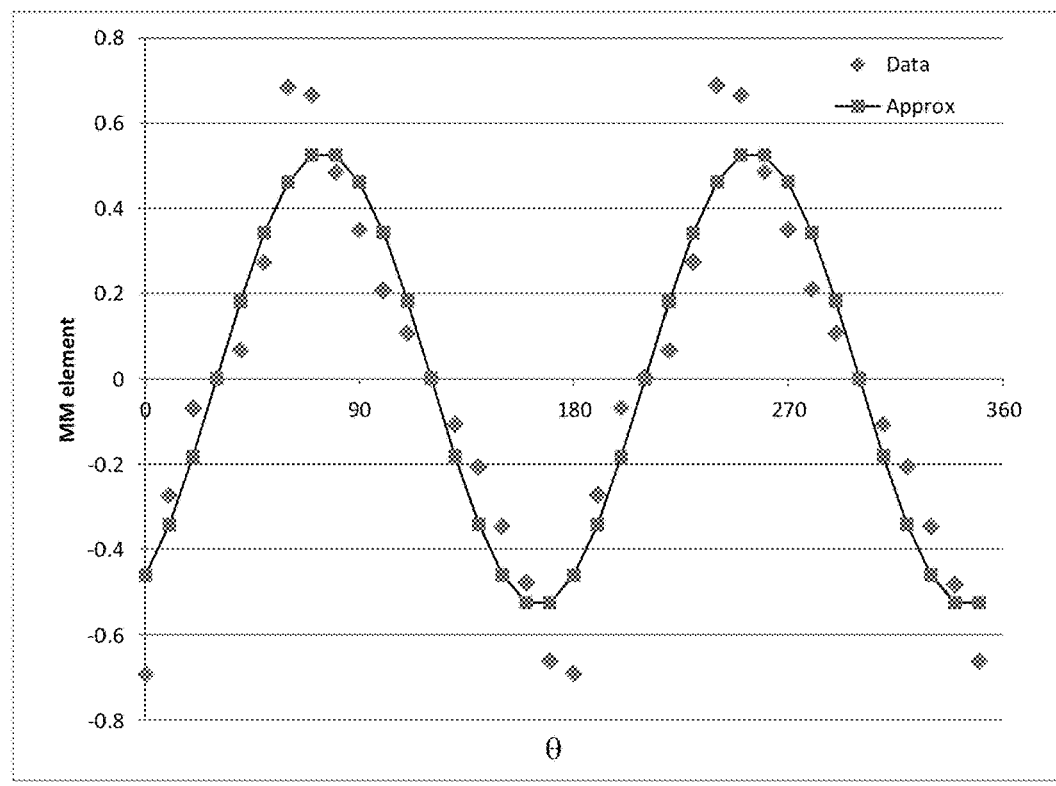
FIG. 16 graphically illustrates finding an azimuth offset by Fourier coefficient for an off-diagonal case.
Figure 17:
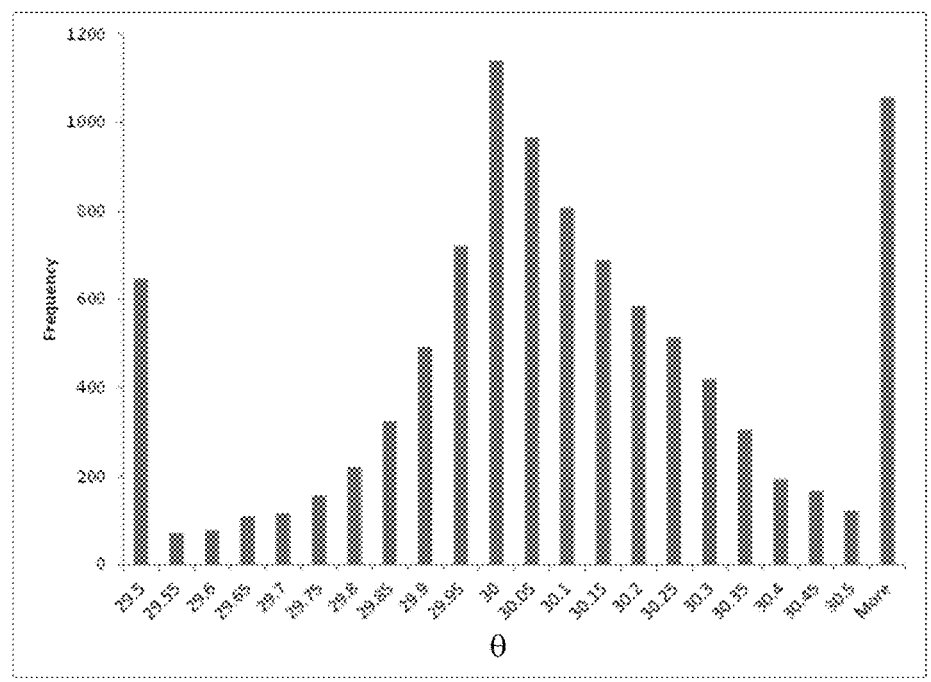
FIG. 17 illustrates results for off-diagonal Mueller matrix elements sine series, 1st harmonic without filtering.

FIG. 16 graphically illustrates finding a POI azimuth angle offset using Fourier coefficients for an off-diagonal case as discussed above, where large POI azimuth angles were used, where $\alpha_{ijk}$=−0.462, $\beta_{ijk}$=0.266, and k=2, and using equation 13, the POI azimuth angle is determined to be 30.03°. FIG. 17 illustrates results for the sample with the shift illustrated in FIG. 16, (all off-diagonal Mueller matrix elements; k=2).

Examples of the types of signals that may be measured with respect to the azimuth angle θ may include, e.g., intensity for P polarized light, S polarized light and unpolarized light. For example, an ideal intensity detector in the Stokes calculus is the row vector that selects the top element of the Stokes vector: [1 0 0 0]. Polarization sensitive detectors can be represented by an intensity detector multiplying any number of Mueller matrices. The most general of these is [$\Gamma_0$ $\Gamma_1$ $\Gamma_2$ $\Gamma_3$], where each $\Gamma_n$ is dimensionless. In general, the intensity as a function of azimuth is then:

$$I(\varphi) = \begin{bmatrix} \Gamma_0 \\ \Gamma_1 \\ \Gamma_2 \\ \Gamma_3 \end{bmatrix}^T [M(\varphi)] \begin{bmatrix} S_0 \\ S_1 \\ S_2 \\ S_3 \end{bmatrix} \quad \text{eq. 14}$$

If input polarization state S and detector type Γ are chosen such that I depends only on elements of M that share a common symmetry, that intensity function may be used to find the symmetry direction. Such cases include $I_{pp}$, $I_{ss}$, $I_{ps}$, $I_{sp}$, $I_{up}$, $I_{us}$, $I_{su}$, $I_{pu}$, and $I_{uu}$, where the first subscript denotes input polarization state (P polarized, S polarized, or unpolarized U) and the second subscript denotes the detected state.

Intensity measurements usually include the effects of the even-symmetry term $M_{11}$, which limits the useful combinations. Fourier components of polarization-modulated signals can effectively select few or individual Mueller elements, so there are many potential combinations useful for locating the axis of symmetry and, thus, the azimuth angle offset. Examples of modulation that may be applied in either input or detection optics includes rotating polarizer, rotating compensator, phase modulator. Additionally, the intensity may be modulated, which is also applicable in either S or F, which may be used to help isolate the signals or mix with the polarization modulation frequencies.

The signals may be generalized spectra ellipsometer type data, e.g., ψ/Δ, ψ_sp/Δ_sp, ψ_ps/Δ_ps, Jones matrix, or combinations of Fourier coefficients of raw CCD signals acquired at analyzer=x and x+π/2. For example, Fourier coefficient signals that may be used include:

$$X_1 = C_2(A) + C_2\left(A + \frac{\pi}{2}\right); \quad \text{eq. 15}$$
$$X_2 = S_2(A) + S_2\left(A + \frac{\pi}{2}\right)$$

where $C_2$ and $S_2$ are the non-normalized Fourier coefficients for cos(2ω) and sin(2ω), respectively, and A is the analyzer azimuth.

Figure 18:
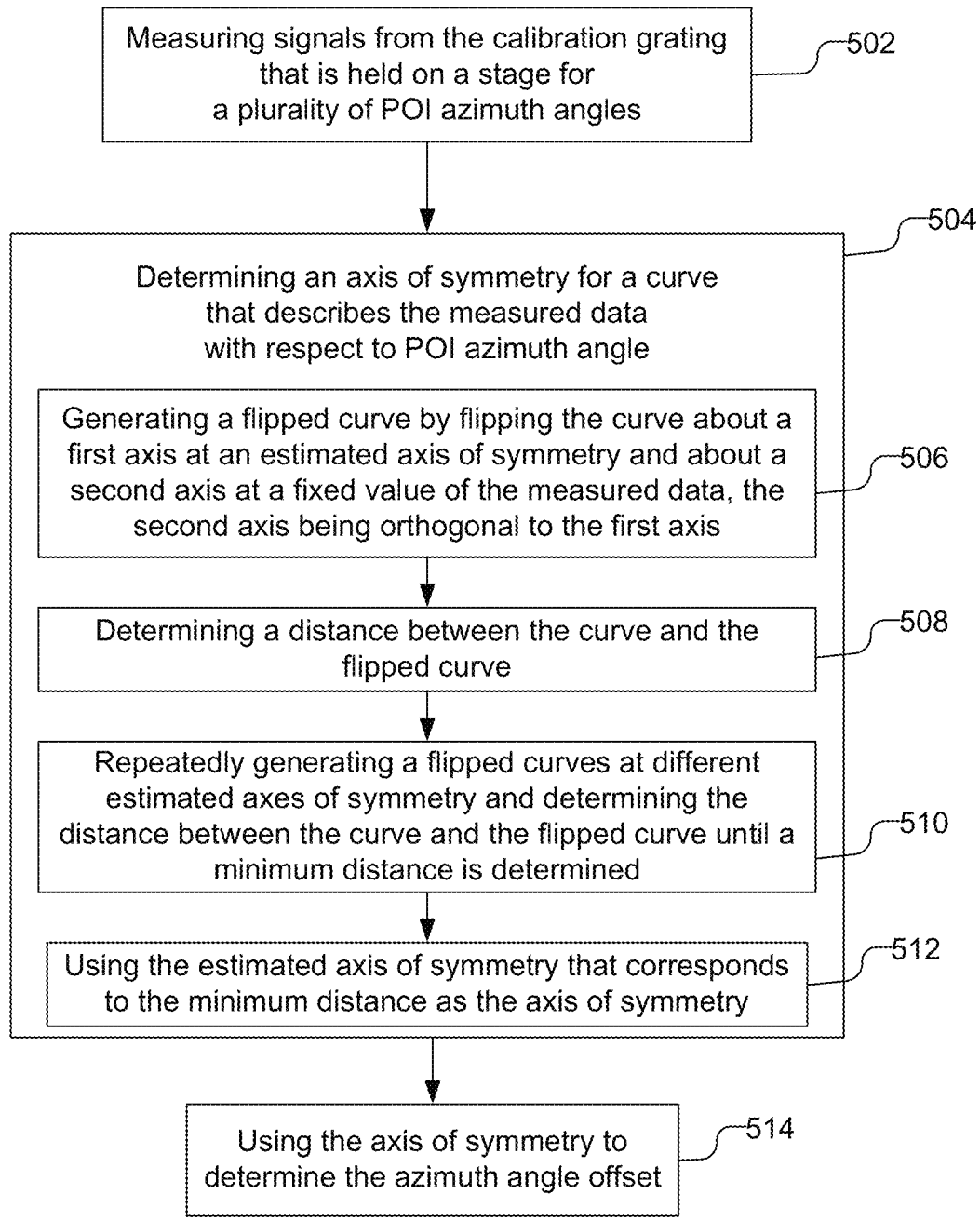
FIG. 18 is another flow chart illustrating a method of calibration for an azimuth angle offset in a plane-of-incidence (POI) azimuth of an optical metrology tool with respect to a stage reference on a stage.

FIG. 18 illustrates another flow chart illustrating a method of calibration of an azimuth angle offset between a plane-of-incidence (POI) of an optical system of an optical metrology tool and an orientation of a calibration grating on a sample at a nominal orientation with respect to the POI. As illustrated, signals are measured from the calibration grating that is held on a stage for a plurality of POI azimuth angles (502). Any desired signals may be measured, including, for example, those discussed above. An axis of symmetry for a curve that describes the measured data with respect to POI azimuth angle is determined (504). As illustrated in FIG. 18, as well as discussed in FIG. 6, determining the axis of symmetry may include generating a flipped curve by flipping the curve about a first axis at an estimated axis of symmetry and about a second axis at a fixed value of the measured data, the second axis being orthogonal to the first axis (506) and determining a distance between the curve and the flipped curve (508). The process includes repeatedly generating flipped curves at different estimated axes of symmetry and determining the distance between the curve and the flipped curve until a minimum distance is determined (510). The estimated axis of symmetry that corresponds to the minimum distance as the axis of symmetry is used as the axis of symmetry (512). The axis of symmetry may then be used to determine the azimuth angle offset (514). If desired, multiple axes of symmetry may be generated, e.g., using multiple wavelengths, or other types of signals, as discussed above. Once the azimuth angle offset is determined, an angular correction may be applied to an orientation of the stage to correct for the azimuth angle offset if desired.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of calibration and correction of an azimuth angle offset of an optical metrology tool, the optical metrology tool having an optical system that produces a beam of light having a plane-of-incidence (POI), wherein the azimuth angle offset is between the POI and an orientation of a calibration grating on a sample at a nominal orientation with respect to the POI, the method comprising:

loading the sample with the calibration grating on a stage of the optical metrology tool, wherein there is the azimuth angle offset between the POI of the optical metrology tool and the orientation of the calibration grating on the sample at the nominal orientation with respect to the POI is unknown;

rotating the stage that holds the sample to a plurality of POI azimuth angles;

measuring with the optical metrology tool signals from the calibration grating at each of the plurality of POI azimuth angles;

determining Fourier coefficients of the signals measured by the optical metrology tool from the calibration grating on the sample at each of the plurality of POI azimuth angles, wherein each of the Fourier coefficients of the signals comprises a value that varies for different POI azimuth angles;

determining an axis of symmetry for a curve describing the Fourier coefficients at the different POI azimuth angles at a single wavelength, wherein the axis of symmetry for the curve is an azimuth angle about which the values of the Fourier coefficients are symmetrically arranged and at which a mirror symmetry plane of the calibration grating is aligned with the POI;

using the axis of symmetry to determine the azimuth angle offset between the POI of the optical metrology tool and the orientation of the calibration grating at the nominal orientation with respect to the POI; and correcting the azimuth angle offset between the POI and the orientation of the calibration grating on the sample on the stage of the optical metrology tool using the determined azimuth angle offset.

2. The method of claim 1, wherein the signals from the calibration grating are measured for a plurality of wavelengths, the method further comprising:
determining the Fourier coefficients of the signals for the plurality of wavelengths;
determining axes of symmetry for curves describing the Fourier coefficients with respect to the plurality of POI azimuth angles for each of the plurality of wavelengths; and
using the axes of symmetry to determine the azimuth angle offset.

3. The method of claim 2, further comprising:
filtering the axes of symmetry before using the axes of symmetry to determine the azimuth angle offset, wherein filtering removes any axis of symmetry that corresponds to a wavelength having sensitivity to the POI azimuth angle below a threshold.

4. The method of claim 2, wherein using the axes of symmetry to determine the azimuth angle offset comprises:
determining a symmetrical azimuth angle as a mean, median or an average of the axes of symmetry; and
using a difference between the symmetrical azimuth angle and the nominal orientation with respect to the POI as the azimuth angle offset.

5. The method of claim 1, wherein determining the axis of symmetry comprises:
generating a flipped curve by flipping the curve about a first axis at an estimated axis of symmetry and about a second axis at a fixed value for the Fourier coefficients, the second axis being orthogonal to the first axis;
determining a distance between the curve and the flipped curve;
repeatedly generating flipped curves at different estimated axes of symmetry and determining the distance between the curve and each flipped curve until a minimum distance is determined; and
using the estimated axis of symmetry that corresponds to the minimum distance as the axis of symmetry.

6. The method of claim 5, wherein determining the distance between the curve and the flipped curve comprises determining a Mean Square Error of distances in a direction parallel to the first axis between a first curve and points on a second curve, wherein the first curve and the second curve are different ones of the flipped curve and the curve.

7. The method of claim 6, further comprising:
filtering the axes of symmetry before using the axes of symmetry to determine the azimuth angle offset, wherein filtering removes any axis of symmetry that corresponds to a wavelength having a Mean Square Error of distances that is greater than a threshold.

8. The method of claim 1, wherein the optical metrology tool is one of a member of a group comprising an ellipsometer, a spectroscopic ellipsometer, a scatterometer, a polarimeter, and a reflectometer.

9. The method of claim 1, wherein correcting the azimuth angle offset of the optical metrology tool comprises applying an angular correction to an orientation of the stage to correct for the azimuth angle offset.

10. The method of claim 1, wherein the calibration grating is either a two-dimensional grating or a three-dimensional grating and includes at least one mirror symmetry plane.

11. The method of claim 1, wherein the signals measured by the optical metrology tool comprise one or more Mueller matrix elements, Fourier coefficients of periodic signals, intensity of P polarized light, intensity of S polarized light or intensity of unpolarized light.

12. The method of claim 1, wherein determining the axis of symmetry comprises performing a Fourier analysis on the curve describing the Fourier coefficients with respect to POI azimuth angle to determine the axis of symmetry.

13. An apparatus comprising:
a stage configured to hold a sample with a calibration grating;
an optical system to produce a beam of light to be incident on the calibration grating and to receive the beam of light after the beam of light interacts with the calibration grating, the beam of light having a plane of incidence (POI), wherein when the sample with the calibration grating is loaded on the stage there is an azimuth angle offset between the POI and an orientation of the calibration grating on the sample at a nominal orientation with respect to the POI;
a detector that detects and generates signals in response to the beam of light after the beam of light interacts with the calibration grating; and
a processor coupled to receive the signals from the detector, wherein the processor is configured to rotate the stage that holds the sample to a plurality of POI azimuth angles, measure signals from the calibration grating at each of the plurality of POI azimuth angles, determine Fourier coefficients of the signals for the plurality of POI azimuth angles, wherein each of the Fourier coefficients of the signals comprises a value that varies for different POI azimuth angles, determine an axis of symmetry for a curve describing the Fourier coefficients at the different POI azimuth angles at a single wavelength, wherein the axis of symmetry for the curve is an azimuth angle about which the values of the Fourier coefficients are symmetrically arranged and at which a mirror symmetry plane of the calibration grating is aligned with the POI, use the axis of symmetry to determine the azimuth angle offset between the POI and the orientation of the calibration grating at the nominal orientation with respect to the POI, and correct the azimuth angle offset between the POI and the orientation of the calibration grating on the sample on the stage using the determined azimuth angle offset.

14. The apparatus of claim 13, wherein the beam of light is a broadband beam of light and wherein the processor is further configured to:
determine Fourier coefficients of the signals for a plurality of wavelengths;
determine axes of symmetry for curves describing the Fourier coefficients with respect to the plurality of POI azimuth angles at each of the plurality of wavelengths; and
use the axes of symmetry to determine the azimuth angle offset.

15. The apparatus of claim 14, wherein the processor is further configured to filter the axes of symmetry before using the axes of symmetry to determine the azimuth angle offset, wherein filtering removes any axis of symmetry that corresponds to a wavelength having sensitivity to the POI azimuth angle below a threshold.

16. The apparatus of claim 14, wherein the processor is configured to use the axes of symmetry to determine the azimuth angle offset by being configured to:
determine a symmetrical azimuth angle as a mean, median or an average of the axes of symmetry; and use a difference between the symmetrical azimuth angle and a nominal orientation with respect to the POI as the azimuth angle offset.

17. The apparatus of claim 13, wherein the processor is configured to determine the axis of symmetry by being configured to:
generate a flipped curve by flipping the curve about a first axis at an estimated axis of symmetry and about a second axis at a fixed value for the Fourier coefficients, the second axis being orthogonal to the first axis;
determine a distance between the curve and the flipped curve;
repeatedly generate flipped curves at different estimated axes of symmetry and determine the distance between the curve and each flipped curve until a minimum distance is determined; and
use the estimated axis of symmetry that corresponds to the minimum distance as the axis of symmetry.

18. The apparatus of claim 17, wherein determining the distance between the curve and the flipped curve comprises determining a Mean Square Error of distances in a direction parallel to the first axis between a first curve and points on a second curve, wherein the first curve and the second curve are different ones of the flipped curve and the curve.

19. The apparatus of claim 18, wherein the processor is further configured to filter the axes of symmetry before using the axes of symmetry to determine the azimuth angle offset, wherein filtering removes any axis of symmetry that corresponds to a wavelength having a Mean Square Error of distances that is greater than a second threshold.

20. The apparatus of claim 13, wherein the apparatus is one of a member of a group comprising an ellipsometer, a spectroscopic ellipsometer, a scatterometer, a polarimeter, and a reflectometer.

21. The apparatus of claim 13, wherein the processor is configured to correct the azimuth angle offset by being configured to apply an angular correction to an orientation of the stage to correct for the azimuth angle offset.

22. The apparatus of claim 13, wherein the calibration grating is either a two-dimensional grating or a three-dimensional grating and includes at least one mirror symmetry plane.

23. The apparatus of claim 13, wherein the signals comprise one or more Mueller matrix elements, Fourier coefficients of periodic signals, intensity of P polarized light, intensity of S polarized light or intensity of unpolarized light.

24. The apparatus of claim 13, wherein the processor is configured to determine the axis of symmetry by being configured to perform a Fourier analysis on the curve describing the Fourier coefficients with respect to POI azimuth angle to determine the axis of symmetry.

* * * * *